US009837270B1

(12) United States Patent
Varadarajan et al.

(10) Patent No.: US 9,837,270 B1
(45) Date of Patent: Dec. 5, 2017

(54) DENSIFICATION OF SILICON CARBIDE FILM USING REMOTE PLASMA TREATMENT

(71) Applicant: Lam Research Corporation, Fremont, CA (US)

(72) Inventors: Bhadri N. Varadarajan, Beaverton, OR (US); Bo Gong, Sherwood, OR (US); Guangbi Yuan, Beaverton, OR (US); Zhe Gui, Beaverton, OR (US); Fengyuan Lai, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/382,137

(22) Filed: Dec. 16, 2016

(51) Int. Cl.
*H01L 21/02* (2006.01)
*H01L 29/16* (2006.01)

(52) U.S. Cl.
CPC .... *H01L 21/02664* (2013.01); *H01L 21/0243* (2013.01); *H01L 21/02529* (2013.01); *H01L 29/1608* (2013.01)

(58) Field of Classification Search
None
See application file for complete search history.

(56) References Cited

U.S. PATENT DOCUMENTS 4,177,474 A 12/1979 Ovshinsky
4,656,110 A 4/1987 Yamazaki
4,895,789 A 1/1990 Motte et al.
4,952,658 A 8/1990 Kalchauer et al.
5,034,355 A 7/1991 Tani et al.
5,108,965 A 4/1992 Tani et al.
5,324,690 A 6/1994 Gelatos et al.
5,447,816 A 9/1995 Kodama et al.
(Continued)

FOREIGN PATENT DOCUMENTS

CA 868641 A 4/1971
CN 101111930 A 1/2008
(Continued)

OTHER PUBLICATIONS

Varadarajan et al., U.S. Appl. No. 15/283,159, filed Sep. 30, 2016 entitled "Remote Plasma Based Deposition of Graded or Multi-Layered Silicon Carbide Film."
(Continued)

*Primary Examiner* — Asok K Sarkar
(74) *Attorney, Agent, or Firm* — Weaver Austin Villeneuve & Sampson LLP

(57) ABSTRACT

Provided are methods and apparatuses for densifying a silicon carbide film using remote plasma treatment. Operations of remote plasma deposition and remote plasma treatment of the silicon carbide film alternatingly occur to control film density. A first thickness of silicon carbide film is deposited followed by a remote plasma treatment, and then a second thickness of silicon carbide film is deposited followed by another remote plasma treatment. The remote plasma treatment can flow radicals of source gas in a substantially low energy state, such as radicals of hydrogen in a ground state, towards silicon carbide film deposited on a substrate. The radicals of source gas in the substantially low energy state promote cross-linking and film densification in the silicon carbide film.

19 Claims, 10 Drawing Sheets

(56) References Cited

U.S. PATENT DOCUMENTS 5,464,699 A 11/1995 Baldi
5,654,208 A 8/1997 Harris et al.
5,739,579 A 4/1998 Chiang et al.
5,807,615 A 9/1998 Sindzingre et al.
5,958,324 A 9/1999 Bujalski et al.
6,045,877 A 4/2000 Gleason et al.
6,100,587 A 8/2000 Merchant et al.
6,150,719 A 11/2000 Saia et al.
6,159,871 A 12/2000 Loboda et al.
6,197,688 B1 3/2001 Simpson
6,242,686 B1 6/2001 Kishimoto et al.
6,262,445 B1 7/2001 Swanson et al.
6,316,167 B1 11/2001 Angelopoulos et al.
6,352,945 B1 3/2002 Matsuki
6,383,898 B1 5/2002 Kishimoto
6,383,955 B1 5/2002 Matsuki et al.
6,395,150 B1 5/2002 Van Cleemput et al.
6,399,484 B1 6/2002 Yamasaki et al.
6,410,419 B1 6/2002 Merchant et al.
6,417,092 B1 7/2002 Jain et al.
6,424,044 B1 7/2002 Han et al.
6,432,846 B1 8/2002 Matsuki
6,448,186 B1 9/2002 Olson et al.
6,455,409 B1 9/2002 Subramanian et al.
6,465,366 B1 10/2002 Nemani et al.
6,465,372 B1 10/2002 Xia et al.
6,506,692 B2 1/2003 Andideh
6,624,064 B1 9/2003 Sahin et al.
6,670,715 B2 12/2003 Yang et al.
6,764,958 B1 7/2004 Nemani et al.
6,767,836 B2 7/2004 San et al.
6,774,489 B2 8/2004 Russell et al.
6,790,767 B2 9/2004 Lee
6,790,788 B2 9/2004 Li et al.
6,846,391 B1 1/2005 Papasouliotis et al.
6,855,645 B2 2/2005 Tang et al.
6,875,687 B1 4/2005 Weidman et al.
6,881,683 B2 4/2005 Matsuki et al.
6,890,850 B2 5/2005 Lee et al.
6,919,270 B2 7/2005 Satoh et al.
6,930,013 B2 8/2005 Choi et al.
6,935,553 B2 8/2005 Suga et al.
6,949,450 B2 9/2005 Chiang et al.
6,967,405 B1 11/2005 Yu et al.
6,991,959 B2 1/2006 Goundar et al.
7,064,088 B2 6/2006 Hyodo et al.
7,091,137 B2 8/2006 Lee et al.
7,115,534 B2 10/2006 Nguyen et al.
7,163,889 B2 1/2007 Yu et al.
7,163,896 B1 1/2007 Zhu et al.
7,200,460 B2 4/2007 Campana et al.
7,239,017 B1 7/2007 Yu et al.
7,253,125 B1 8/2007 Bandyopadhyay et al.
7,256,139 B2 8/2007 Moghadam et al.
7,282,438 B1 10/2007 Yu et al.
7,381,662 B1 6/2008 Niu et al.
7,420,275 B1 9/2008 Yu et al.
7,468,290 B2 12/2008 Lukas et al.
7,573,061 B1 8/2009 Yu et al.
7,622,400 B1 11/2009 Fox et al.
7,662,355 B2 2/2010 Kamisako et al.
7,736,728 B2 6/2010 Loboda et al.
7,842,604 B1 11/2010 Yu et al.
7,915,166 B1 3/2011 Yu et al.
7,923,385 B2 4/2011 Wu et al.
7,968,436 B1 6/2011 Yu et al.
8,021,992 B2 9/2011 Liou et al.
8,053,372 B1 11/2011 Greer et al.
8,124,522 B1 2/2012 Wu et al.
8,168,268 B2 5/2012 Ovshinsky
8,173,537 B1 5/2012 Chattopadhyay et al.
8,178,168 B2 5/2012 O'Neill et al.
8,178,443 B2 5/2012 Rangarajan et al.
8,247,332 B2 8/2012 Rangarajan et al.
8,669,181 B1 3/2014 Yu et al.
8,846,525 B2 9/2014 Rangarajan et al.
9,234,276 B2 1/2016 Varadarajan
9,337,068 B2 5/2016 Antonelli et al.
9,371,579 B2 6/2016 Varadarajan et al.
2001/0021491 A1 9/2001 Chen et al.
2002/0016085 A1 2/2002 Huang et al.
2002/0019148 A1 2/2002 Hawryluk et al.
2002/0024117 A1 2/2002 Russell et al.
2002/0039625 A1 4/2002 Powell et al.
2002/0106891 A1 8/2002 Kim et al.
2002/0132101 A1 9/2002 Fonash et al.
2003/0001275 A1 1/2003 Sambucetti et al.
2003/0036215 A1 2/2003 Reid
2003/0049460 A1 3/2003 O'Neill et al.
2003/0057553 A1 3/2003 DelaRosa et al.
2003/0064154 A1 4/2003 Laxman et al.
2003/0068881 A1 4/2003 Xia et al.
2003/0082296 A1 5/2003 Elers et al.
2003/0089992 A1 5/2003 Rathi et al.
2003/0154141 A1 8/2003 Capazario et al.
2003/0162033 A1 8/2003 Johnson et al.
2003/0194496 A1 10/2003 Xu et al.
2003/0232150 A1 12/2003 Arnold
2003/0232514 A1 12/2003 Kim et al.
2004/0067308 A1 4/2004 Zheng et al.
2004/0084680 A1 5/2004 Ruelke et al.
2004/0084774 A1 5/2004 Li et al.
2004/0089924 A1 5/2004 Yuasa et al.
2004/0113279 A1 6/2004 Chen et al.
2004/0115876 A1 6/2004 Goundar et al.
2004/0124531 A1 7/2004 Venkatraman et al.
2004/0161535 A1 8/2004 Goundar et al.
2004/0178169 A1 9/2004 Desphande et al.
2004/0194706 A1 10/2004 Wang et al.
2004/0207084 A1 10/2004 Hedrick et al.
2005/0014361 A1 1/2005 Nguyen et al.
2005/0042889 A1 2/2005 Lee et al.
2005/0100682 A1 5/2005 Fukiage et al.
2005/0202685 A1 9/2005 Huang et al.
2005/0233555 A1 10/2005 Rajagopalan et al.
2005/0236711 A1 10/2005 Wang et al.
2005/0245071 A1 11/2005 Wu et al.
2005/0255714 A1 11/2005 Iyer et al.
2005/0277302 A1 12/2005 Nguyen et al.
2005/0287811 A1 12/2005 Inukai
2006/0019486 A1 1/2006 Yu et al.
2006/0040507 A1 2/2006 Mak et al.
2006/0110931 A1 5/2006 Fukazawa et al.
2007/0004204 A1 1/2007 Fukazawa et al.
2007/0141812 A1 6/2007 Zagwijn et al.
2007/0166546 A1 7/2007 Ichikawa et al.
2007/0232071 A1 10/2007 Balseanu et al.
2007/0264839 A1 11/2007 Van Gompel et al.
2007/0281497 A1 12/2007 Liu et al.
2008/0050933 A1 2/2008 Ozaki et al.
2008/0063809 A1 3/2008 Lee et al.
2008/0064173 A1 3/2008 Hung
2008/0070396 A1 3/2008 Budrevich et al.
2008/0099754 A1 5/2008 Enicks
2008/0122103 A1 5/2008 Bonilla et al.
2008/0128907 A1 6/2008 Yang et al.
2008/0173984 A1 7/2008 Lin et al.
2008/0217746 A1 9/2008 Morita et al.
2008/0254641 A1 10/2008 Kobayashi et al.
2009/0042402 A1 2/2009 Morioka
2009/0082240 A1 3/2009 Nukui et al.
2009/0215282 A1 8/2009 Moore et al.
2009/0218699 A1 9/2009 Torres et al.
2009/0258487 A1 10/2009 Lin et al.
2009/0264277 A1 10/2009 Raj et al.
2009/0294925 A1 12/2009 Lin et al.
2010/0075077 A1 3/2010 Bicker et al.
2010/0081293 A1 4/2010 Mallick et al.
2010/0207274 A1 8/2010 Hayashi et al.
2010/0308463 A1 12/2010 Yu et al.
2011/0027957 A1 2/2011 Berry
2011/0045676 A1 2/2011 Park et al.
2011/0111590 A1 5/2011 Edelstein et al.
2011/0114994 A1 5/2011 Mandlik et al.

(56) References Cited

U.S. PATENT DOCUMENTS

| | | | |
|---|---|---|---|
| 2011/0135557 | A1 | 6/2011 | Rangarajan et al. |
| 2011/0193230 | A1 | 8/2011 | Nogami et al. |
| 2011/0236594 | A1 | 9/2011 | Haverkamp et al. |
| 2012/0009802 | A1 | 1/2012 | LaVoie et al. |
| 2012/0077349 | A1 | 3/2012 | Li |
| 2012/0122302 | A1* | 5/2012 | Weidman .............. C23C 16/325 438/478 |
| 2012/0142172 | A1 | 6/2012 | Fox et al. |
| 2012/0241089 | A1 | 9/2012 | Dielmann et al. |
| 2013/0075455 | A1 | 3/2013 | Shimizu |
| 2013/0119406 | A1 | 5/2013 | Notsu et al. |
| 2013/0129940 | A1 | 5/2013 | Xiao et al. |
| 2013/0157466 | A1 | 6/2013 | Fox et al. |
| 2013/0242493 | A1 | 9/2013 | Shenoy et al. |
| 2013/0330932 | A1 | 12/2013 | Rangarajan et al. |
| 2013/0330935 | A1 | 12/2013 | Varadarajan |
| 2014/0175617 | A1 | 6/2014 | Antonelli et al. |
| 2014/0356549 | A1 | 12/2014 | Varadarajan |
| 2015/0118394 | A1 | 4/2015 | Varadarajan et al. |
| 2015/0303056 | A1 | 10/2015 | Varadarajan et al. |
| 2016/0090649 | A1 | 3/2016 | Varadarajan |
| 2016/0276140 | A1 | 9/2016 | Varadarajan et al. |
| 2016/0314964 | A1 | 10/2016 | Tang et al. |

FOREIGN PATENT DOCUMENTS

| | | | |
|---|---|---|---|
| CN | 101536191 | A | 9/2009 |
| EP | 1 172 845 | A2 | 1/2002 |
| EP | 1 186 685 | A2 | 3/2002 |
| JP | 2001-160547 | | 6/2001 |
| JP | 2002-176100 | | 6/2002 |
| JP | 2002-217189 | | 8/2002 |
| JP | 2004-247725 | | 9/2004 |
| JP | 2007-158000 | | 6/2007 |
| JP | 2008-529296 | | 7/2008 |
| KR | 10-2009-0121361 | | 11/2009 |
| TW | 476807 | B | 2/2002 |
| TW | 535253 | B | 6/2003 |
| TW | 200405437 | | 4/2004 |
| TW | 200803988 | | 1/2008 |
| TW | 200839884 | | 10/2008 |
| TW | 200903635 | A | 1/2009 |
| TW | 200908138 | | 2/2009 |
| TW | 201214512 | A1 | 4/2012 |
| TW | 201214563 | A | 4/2012 |
| TW | 201240012 | A1 | 10/2012 |
| WO | WO 2007/116492 | | 10/2007 |

OTHER PUBLICATIONS

Wu et al., U.S. Appl. No. 11/693,661, filed Mar. 29, 2007 entitled "Methods for Improving Performance of ODC Film With Dielectric Constant < 4.0 ."

U.S. Office Action dated Dec. 19, 2014 issued in U.S. Appl. No. 13/907,699.

U.S. Final Office Action dated May 14, 2015 issued in U.S. Appl. No. 13/907,699.

U.S. Advisory Action and Examiner Initiated Interview Summary dated Aug. 12, 2015 issued in U.S. Appl. No. 13/907,699.

U.S. Notice of Allowance dated Sep. 10, 2015 issued in in U.S. Appl. No. 13/907,699.

U.S. Office Action dated Sep. 15, 2015 issued in U.S. Appl. No. 14/062,648.

U.S. Notice of Allowance dated Feb. 19, 2016 issued in U.S. Appl. No. 14/062,648.

U.S. Office Action dated Nov. 2, 2015 issued in U.S. Appl. No. 14/616,435.

U.S. Final Office Action dated Mar. 10, 2016 issued in U.S. Appl. No. 14/616,435.

U.S. Office Action dated Jul. 8, 2016 issued in U.S. Appl. No. 14/616,435.

U.S. Office Action dated Sep. 12, 2016 issued in U.S. Appl. No. 14/692,627.

U.S. Office Action dated Feb. 24, 2005 issued in U.S. Appl. No. 10/670,660.

U.S. Notice of Allowance dated Sep. 11, 2006 issued in U.S. Appl. No. 11/234,808.

U.S. Office Action dated May 3, 2006 issued in U.S. Appl. No. 10/915,117.

US Final Office Action dated Sep. 7, 2006 issued in U.S. Appl. No. 10/915,117.

US Office Action dated Dec. 11, 2006 issued in U.S. Appl. No. 10/915,117.

US Notice of Allowance dated Feb. 26, 2007 issued in U.S. Appl. No. 10/915,117.

US Office Action dated May 1, 2008 issued in U.S. Appl. No. 11/373,847.

US Notice of Allowance and Allowed Claims dated Jul. 1, 2008 issued in U.S. Appl. No. 11/373,847.

US Office Action dated Apr. 10, 2009 issued in U.S. Appl. No. 11/805,356.

US Final Office Action dated Oct. 13, 2009 issued in U.S. Appl. No. 11/805,356.

US Office Action dated Apr. 8, 2010 issued in U.S. Appl. No. 11/805,356.

US Notice of Allowance and Allowed Claims dated Jul. 26, 2010 issued in U.S. Appl. No. 11/805,356.

US Office Action dated Sep. 6, 2006 issued in U.S. Appl. No. 10/869,474.

US Office Action dated Feb. 9, 2007 issued in U.S. Appl. No. 10/869,474.

US Final Office Action dated Jun. 28, 2007 issued in U.S. Appl. No. 10/869,474.

US Notice of Allowance dated Jul. 26, 2007 issued in U.S. Appl. No. 10/869,474.

US Office Action dated Mar. 17, 2008 issued in U.S. Appl. No. 11/893,490.

US Office Action dated Aug. 8, 2008 issued in U.S. Appl. No. 11/893,490.

US Office Action (Ex Parte Quayle) dated Jan. 27, 2009 issued in U.S. Appl. No. 11/893,490.

US Notice of Allowance dated May 4, 2009 issued in U.S. Appl. No. 11/893,490.

US Office Action dated Oct. 15, 2010 issued in U.S. Appl. No. 12/497,322.

US Notice of Allowance and Allowed Claims dated Mar. 11, 2011 issued in U.S. Appl. No. 12/497,322.

US Office Action dated Nov. 20, 2009 issued in U.S. Appl. No. 11/710,652.

US Final Office Action dated Apr. 15, 2010 issued in U.S. Appl. No. 11/710,652.

US Office Action dated Aug. 5, 2010 issued in U.S. Appl. No. 11/710,652.

US Notice of Allowance and Allowed Claims dated Nov. 24, 2010 issued in U.S. Appl. No. 11/710,652.

US Office Action dated Jul. 9, 2013 issued in U.S. Appl. No. 11/710,652.

US Notice of Allowance dated Oct. 25, 2013 issued in U.S. Appl. No. 11/710,652.

US Office Action dated Aug. 28, 2009 issued in U.S. Appl. No. 11/693,661.

US Office Action dated Feb. 24, 2010 issued in U.S. Appl. No. 11/693,661.

US Final Office Action dated Nov. 5, 2010 issued in U.S. Appl. No. 11/693,661.

US Office Action dated Dec. 31, 2008 issued in U.S. Appl. No. 11/693,617.

US Office Action dated Oct. 7, 2009 issued in U.S. Appl. No. 11/693,617.

US Office Action dated Jun. 10, 2010 issued in U.S. Appl. No. 11/693,617.

US Final Office Action dated Jan. 20, 2011 issued in U.S. Appl. No. 11/693,617.

(56) References Cited

OTHER PUBLICATIONS

US Office Action dated Sep. 16, 2011 issued in U.S. Appl. No. 11/693,617.
US Notice of Allowance dated Jan. 9, 2012 issued in U.S. Appl. No. 11/693,617.
US Office Action dated Jan. 12, 2011 issued in U.S. Appl. No. 12/082,496.
US Final Office Action dated Aug. 4, 2011 issued in U.S. Appl. No. 12/082,496.
US Notice of Allowance dated Oct. 26, 2011 issued in U.S. Appl. No. 12/082,496.
US Notice of Allowance dated Apr. 10, 2012 issued in U.S. Appl. No. 12/631,691.
US Office Action dated Feb. 7, 2014 issued in U.S. Appl. No. 13/967,832.
US Notice of Allowance dated May 30, 2014 issued in U.S. Appl. No. 13/967,832.
US Notice of Allowance dated Sep. 5, 2014 issued in U.S. Appl. No. 13/967,832.
US Office Action dated Sep. 29, 2015 issued in U.S. Appl. No. 14/105,026.
US Notice of Allowance dated Jan. 29, 2016 issued in U.S. Appl. No. 14/105,026.
US Office Action dated Feb. 7, 2014 issued in U.S. Appl. No. 13/494,836.
US Final Office Action dated Aug. 21, 2014 issued in U.S. Appl. No. 13/494,836.
US Office Action dated May 5, 2015 issued in U.S. Appl. No. 13/494,836.
US Final Office Action dated Nov. 16, 2015 issued in U.S. Appl. No. 13/494,836.
US Office Action dated Mar. 10, 2016 issued in U.S. Appl. No. 13/494,836.
US Final Office Action dated Jul. 11, 2016 issued in U.S. Appl. No. 13/494,836.
US Office Action dated Jan. 9, 2017 issued in U.S. Appl. No. 13/494,836.
Chinese First Office Action dated Sep. 5, 2016 issued in Application No. CN 201410576747.1.
Chinese First Office Action dated Jan. 24, 2014 issued in Application No. CN 201010569747.0.
Chinese Second Office Action dated Aug. 14, 2014 issued in Application No. CN 201010569747.0.
Chinese Third Office Action dated Jan. 13, 2015 issued in Application No. CN 201010569747.0.
Japanese Office Action dated Jul. 29, 2014 issued in Application No. JP 2010-256165.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Office Action dated Dec. 22, 2015 issued in Application No. TW 102120742.
Benilan et al., (Oct. 4, 2011) "Optimization of microwave Hydrogen plasma discharges to mimic Lyman $\alpha$ (121.6 nm) solar irradiations," *EPSC-DPS2011-1317, EPSC-DPJ Joint Meeting 2011, EPSC Abstracts*, 6:2pp.
Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.
Fozza et al., (Jan./Feb.1998) "Vacuum ultraviolet to visible emission of some pure gases and their mixtures used for plasma processing," *J. Vac. Sci. Technol. A*, American Vacuum Society, 16(1):72-77.
Grubbs et al. (May/Jun. 2006) "Attenuation of hydrogen radicals traveling under flowing gas conditions through tubes of different materials," *J. Vac. Sci. Technol. A*, 24(3):486-496.
Hatanaka et al., (2000) "Experiments and analyses of SiC thin film deposition from organo-silicon by a remote plasma method," *Thin Solid Films*, 368:287-291.
Huran, J., et al., (2004) "RBS study of amorphous silicon carbide films deposited by PECVD," *Czechoslovak Journal of Physics*, 54(Suppl. C):C1006-C1010.
"Radical (chemistry)" From Wikipedia, the free encyclopedia, [downloaded at http://en.wikipedia.org/wiki/Radical_(chemistry) on Sep. 23, 2015), 11 pages.
Xu, Ying-Yu, et al., (1999) "Preparation of SiC Thin Film Using Organosilicon by Remote Plasma CVD Method," *Mat. Res. Soc. Symp. Proc.*, 544:185-189.
Jones et al., (Nov. 30, 2001) "Silicon Containing Polymers: The Science and Technology of Their Synthesis and Applications," *Springer*, p. 705.
Lemaire, P.J., Walker, K.L., Kranz, K.S., Huff, R.G. And DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.
Maeda et al. (Sep. 1989), "A Low-Permittivity Interconnection Using an SiBN Interlayer," *IEEE Transactions on Electron Devices* 36(9).
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Wróbel et al. (2001) "Oligomerization and Polymerization Steps in Remote Plasma Chemical Vapor Deposition of Silicon-Carbon and Silica Films from Organosilicon Sources," *Chem. Mater*, 13(5):1884-1895.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 24:201-207.
Wu et al. (Oct. 17-19, 2006), "Ultra Low k Dielectrics Prepared by PECVD Using a Single-Precursor and Treated by UV Assisted Thermal Processing," *Advanced Metallization Conference* (*AMC*) 2006, pp. 1-6, San Diego, CA.
U.S. Final Office Action dated Feb. 22, 2017 issued in U.S. Appl. No. 14/616,435.
US Final Office Action, dated May 19, 2017, issued in U.S. Appl. No. 14/692,627.
Chinese First Office Action dated Jul. 3, 2017 issued in Application No. CN 201510566292.X.
Korean Office Action dated Feb. 20, 2017 issued in Application No. KR 10-2010-0123145.
Taiwan Examination Report dated Mar. 14, 2017 issued in Application No. TW 102146997.
Taiwan Examination Report dated Aug. 8, 2017 issued in Application No. TW 102146997.

* cited by examiner

DENSIFICATION OF SILICON CARBIDE FILM USING REMOTE PLASMA TREATMENT

BACKGROUND

The present disclosure relates generally to the formation of silicon carbide films, and more particularly to remote plasma deposition and remote plasma treatment for densifying silicon carbide films.

The silicon carbide (SiC) class of thin films has unique physical, chemical, and mechanical properties and is used in a variety of applications, particularly integrated circuit applications. Classes of SiC thin films include oxygen doped silicon carbide, also known as silicon oxycarbide, nitrogen doped silicon carbide, also known as silicon nitricarbide, and oxygen and nitrogen doped silicon carbide, also known as silicon oxynitricarbide, and undoped silicon carbide.

SUMMARY

This disclosure pertains to a method of densifying a silicon carbide film. The method includes providing a substrate in a reaction chamber, depositing a first thickness of a silicon carbide film on the substrate, and exposing the first thickness of the silicon carbide film to remote hydrogen plasma treatment where the first thickness of the silicon carbide film is densified, depositing a second thickness of the silicon carbide film over the first thickness of the silicon carbide film, and exposing the second thickness of the silicon carbide film to remote hydrogen plasma treatment where the second thickness of the silicon carbide film is densified.

In some implementations, each of the first thickness and the second thickness is between about 5 Å and about 30 Å. In some implementations, depositing the first thickness of the silicon carbide film includes: (a) flowing one or more silicon-containing precursors into the reaction chamber, and (b) flowing one or more hydrogen radicals generated from a remote plasma source to react with the one or more silicon-containing precursors for a first time period, where depositing the second thickness of the silicon carbide film includes repeating operations (a) and (b) for a second time period. In some implementations, each of the one or more silicon-containing precursors have (i) one or more silicon-hydrogen bonds and/or silicon-silicon bonds, and (ii) one or more silicon-carbon bonds, silicon-nitrogen bonds, and/or silicon-oxygen bonds. In some implementations, each of the one or more silicon-containing precursors is selected from a group consisting of: a cyclic siloxane, a linear siloxane, an alkoxy silane, an alkyl silane, and a silazane. In some implementations, at least 90% of the hydrogen radicals are hydrogen radicals in a ground state. In some implementations, exposing the first thickness of the silicon carbide film to remote hydrogen plasma treatment includes: (c) flowing a source gas of hydrogen into a remote plasma source, (d) flowing an inert gas with the source gas of hydrogen, (e) generating, from the source gas of hydrogen, radicals of hydrogen in the remote plasma source, and (f) flowing the radicals of hydrogen to the first thickness of the silicon carbide film, where exposing the second thickness of the silicon carbide film to remote hydrogen plasma treatment includes repeating operations (c) through (f) on the second thickness of the silicon carbide film. In some implementations, the inert gas is helium, and the source gas of hydrogen in the helium has a concentration of 1-10% hydrogen. In some implementations, exposing the first thickness of the silicon carbide film to remote hydrogen plasma treatment further includes: (g) flowing a co-reactant gas with the source gas, wherein the co-reactant gas includes oxygen ($O_2$), nitrogen ($N_2$), carbon dioxide ($CO_2$), carbon monoxide (CO), water ($H_2O$), methanol ($CH_3OH$), ozone ($O_3$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), or combinations thereof, where exposing the second thickness of the silicon carbide film to remote hydrogen plasma treatment further includes repeating operation (g) to the second thickness of the silicon carbide film. In some implementations, a pressure in the reaction chamber is between about 0.2 Torr and about 5 Torr. In some implementations, exposing the first thickness of the silicon carbide film to remote hydrogen plasma treatment occurs for a duration between about 5 seconds and about 50 seconds, and exposing the second thickness of the silicon carbide film to remote hydrogen plasma treatment occurs for a duration between about 5 seconds and about 50 seconds.

This disclosure also pertains to an apparatus for densifying a silicon carbide film. The apparatus includes a reaction chamber, a plasma source remote from the reaction chamber, a substrate support for holding a substrate in the reaction chamber, and a controller configured with instructions for providing the following operations: providing the substrate in the reaction chamber, depositing a first thickness of a silicon carbide film on the substrate, and exposing the first thickness of the silicon carbide film to remote hydrogen plasma treatment where the first thickness of the silicon carbide film is densified, depositing a second thickness of the silicon carbide film over the first thickness of the silicon carbide film, and exposing the second thickness of the silicon carbide film to remote hydrogen plasma treatment where the second thickness of the silicon carbide film is densified.

In some implementations, each of the first thickness and the second thickness is between about 5 Å and about 30 Å. In some implementations, depositing the first thickness of the silicon carbide film includes: (a) flowing one or more silicon-containing precursors into the reaction chamber, and (b) flowing one or more hydrogen radicals generated from a remote plasma source to react with the one or more silicon-containing precursors for a first time period, where depositing the second thickness of the silicon carbide film includes repeating operations (a) and (b) for a second time period. In some implementations, at least 90% of the hydrogen radicals are hydrogen radicals in a ground state. In some implementations, exposing the first thickness of the silicon carbide film to remote hydrogen plasma treatment includes: (c) flowing a source gas of hydrogen into a remote plasma source, (d) flowing an inert gas with the source gas of hydrogen, (e) generating, from the source gas of hydrogen, radicals of hydrogen in the remote plasma source, and (f) flowing the radicals of hydrogen to the first thickness of the silicon carbide film, where exposing the second thickness of the silicon carbide film to remote hydrogen plasma treatment includes repeating operations (c) through (f) on the second thickness of the silicon carbide film. In some implementations, the inert gas is helium, and the source gas of hydrogen in the helium has a concentration of 1-10% hydrogen. In some implementations, a pressure in the reaction chamber is between about 0.2 Torr and about 5 Torr.

These and other embodiments are described further below with reference to the figures.

DETAILED DESCRIPTION

Figure 1A:
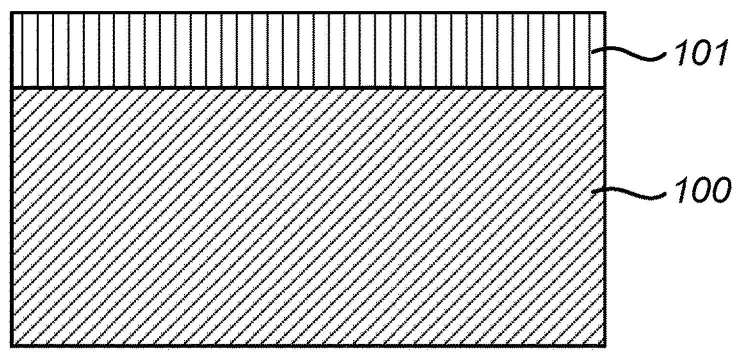
FIG. 1A illustrates a cross-section of an example silicon carbide film deposited over a substrate.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards, magnetic recording media, magnetic recording sensors, mirrors, optical elements, micro-mechanical devices and the like and the like.

Introduction

Manufacture of semiconductor devices typically involves depositing one or more thin films on a substrate in an integrated fabrication process. In some aspects of the fabrication process, classes of thin films such as silicon carbide, silicon oxycarbide, silicon nitricarbide, and silicon oxynitricarbide are deposited using atomic layer deposition (ALD), chemical vapor deposition (CVD), plasma-enhanced chemical vapor deposition (PECVD), or any other suitable deposition method. As used herein, the term silicon carbide includes undoped or doped silicon carbides, such oxygen doped silicon carbide (SiCO), nitrogen doped silicon carbide (SiCN), and nitrogen and oxygen doped silicon carbide (SiOCN). For many, doped silicon carbides have at most about 50% atomic of dopant atoms, whether those atoms are oxygen, nitrogen, or atoms of another element. The doping level provides desired film properties.

Precursor molecules for depositing silicon carbides can include silicon-containing molecules having silicon-hydrogen (Si—H) and/or silicon-silicon (Si—Si) bonds, and silicon-carbon (Si—C) bonds. Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon nitricarbides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. Current PECVD processes may use in situ plasma processing in which a plasma is provided directly adjacent to a substrate.

It has been found that depositing high-quality silicon carbide thin films can have certain challenges, such as providing films with excellent step coverage, low dielectric constants, high breakdown voltages, low leakage currents, high porosity, and/or coverage over exposed metal surfaces without oxidizing the metal surfaces.

While this disclosure is not limited by any particular theory, it is believed that the plasma conditions in typical PECVD processes fragment the silicon-containing precursor molecules in a manner that produces undesirable effects. For example, PECVD may break Si—O and/or Si—C bonds in the precursor molecules to produce highly reactive radicals or other fragment types having high sticking coefficients. The fragments of the resulting doped silicon carbide film can include silicon, carbon, and/or oxygen atoms with bonds that are "dangling," meaning that silicon, carbon, and/or oxygen atoms have reactive unpaired valence electrons. High sticking coefficients of the precursor molecules and their fragments can deposit silicon carbide films with poor step coverage, as reactive precursor fragments may disproportionately stick to the upper regions of sidewalls and other structures in recessed features.

The dangling bonds can produce silanol groups (Si—OH) in a deposited silicon oxycarbide or silicon oxynitricarbide film. As a result, the film may have detrimentally high dielectric constants. Film quality may also suffer because the direct plasma conditions tend to extract carbon out of the deposited film.

Furthermore, the dangling bonds can produce increased silicon-hydrogen bonding (Si—H) in deposited silicon carbide films. Broken bonds of Si—C can be replaced with Si—H in direct plasma deposition conditions. The presence of Si—H bonds in silicon carbide films can produce films with poor electrical properties. For example, the presence of Si—H bonds can reduce breakdown voltages and can increase leakage currents because the Si—H bonds provide a leakage path for electrons.

Further, the dangling bonds can lead to uncontrolled chemical or morphological structures in the silicon carbide films. In some cases, such structures are dense filaments having low or no porosity, such that the film has an unacceptably high dielectric constant. The lack of porosity can be the result of the direct plasma conditions breaking Si—C and/or Si—O bonds in cyclic siloxanes that would otherwise provide porosity in an ultralow-k dielectric material.

Direct plasma conditions sometimes employed in PECVD can lead to directionality in the deposition because the energy to break up the precursor molecules can be a low frequency which creates a lot of ion bombardment at the surface. The directional deposition can also lead to deposition of silicon carbide films with poor step coverage. A direct plasma is a plasma in which the plasma (electrons and positive ions at an appropriate concentration) reside in close proximity to the substrate surface during deposition, sometimes separated from the substrate surface by only a plasma sheath.

Typical PECVD processes are sometimes inappropriate for depositing silicon carbide films over exposed copper or other metal surfaces because such processes can oxidize metal. The PECVD process may use oxidants such as oxygen ($O_2$), ozone ($O_3$), carbon dioxide ($CO_2$), or other oxidizing species to form a silicon oxycarbide film.

Environment at the Substrate Surface During Deposition

FIG. 1A illustrates a cross-section of an example silicon carbide film deposited over a substrate. The silicon carbide film 101 can be formed under process conditions producing a relatively mild environment adjacent to the substrate 100. The substrate 100 can be any wafer, semiconductor wafer, partially fabricated integrated circuit, printed circuit board, display screen, or other appropriate work piece. The process for depositing the silicon carbide film 101 can involve one or more silicon-containing precursors having one or more Si—H bonds and/or one or more Si—Si bonds, along with other bonds such as Si—C bonds, Si—O bonds, and/or Si—N bonds, depending on the type of doped structure to be produced.

Figure 1B:
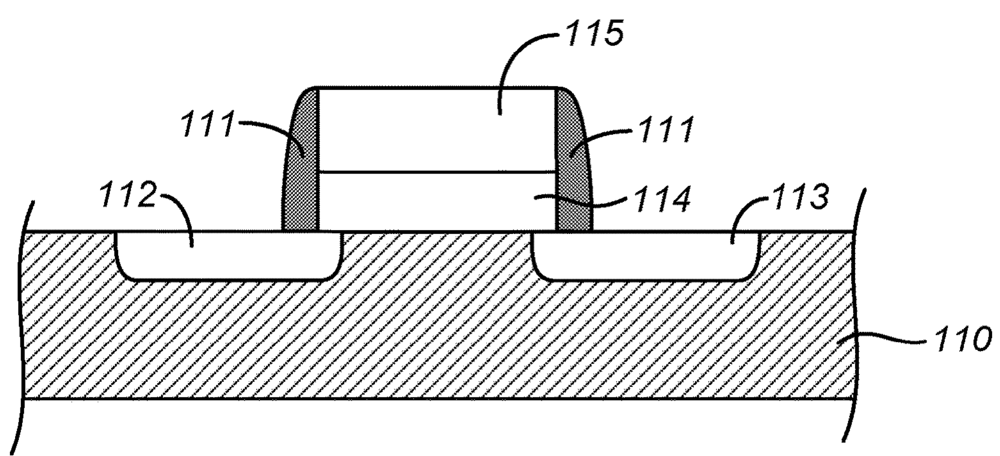
FIG. 1B illustrates silicon carbide vertical structures on the sidewalls of a gate electrode structure of a transistor.
Figure 1C:
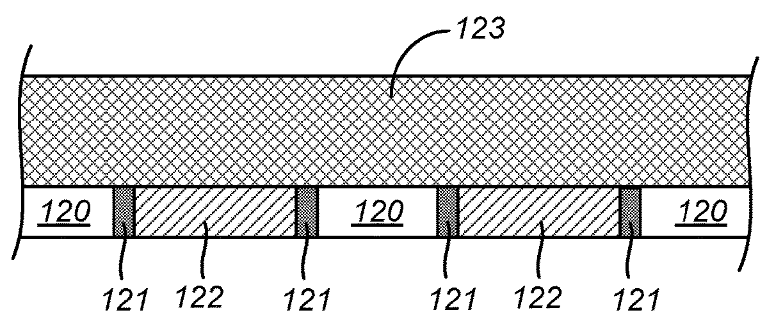
FIG. 1C illustrates silicon carbide vertical structures on exposed sidewalls of copper lines in an air gap type metallization layer.
Figure 1D:
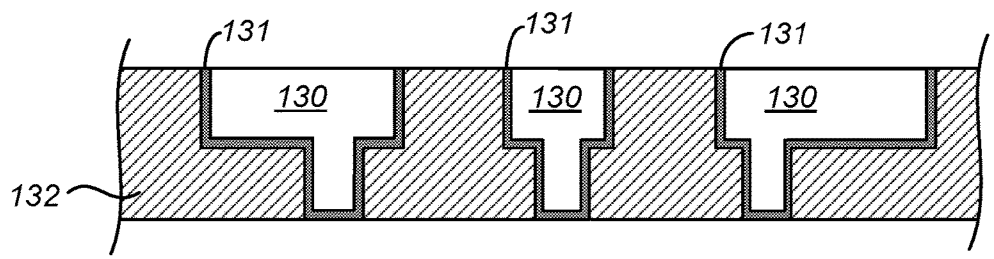
FIG. 1D illustrates silicon carbide pore sealants for porous dielectric materials.

Certain applications employing silicon carbide films are depicted in FIGS. 1B-1D. In some embodiments, the silicon-containing precursors can include silicon-oxygen containing precursors, silicon-nitrogen containing precursors, and/or silicon-carbon containing precursors. The silicon-oxygen containing precursors can include one or more Si—O bonds, the silicon-nitrogen containing precursors can include one or more Si—N bonds, and the silicon-carbon containing precursors can include one or more Si—C bonds. In some embodiments, for example, the silicon-containing precursors can include a single reactant A with Si—O and Si—C bonds, or Si—N and Si—C bonds. In some embodiments, the silicon-containing precursors can include a reactant B with Si—O bonds or Si—N bonds, and a reactant C with Si—C bonds. It will be understood that any number of suitable reactants may be employed in the scope of this present disclosure. The chemical structures of example silicon-containing precursors are discussed in further detail below.

The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in the deposited silicon carbide film 101. The broken bonds can also serve as sites for cross-linking during thermal processing conducted during or after deposition. Bonding at the reactive sites and cross-linking can form a primary backbone or matrix collectively in the resulting silicon carbide film 101.

In some embodiments, the process conditions can substantially preserve Si—C bonds and, if present, Si—O and Si—N bonds in the as-deposited layer of the silicon carbide film 101. Accordingly, the reaction conditions adjacent to the substrate 100 provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, introduction of a co-reactant such as oxygen may extract carbon from Si—C bonds. Generally, the described reaction conditions exist at the exposed face of the substrate 100 (the face where the silicon carbide film 101 is deposited). They may further exist at some distance above the substrate 100, e.g., about 0.5 micrometers to about 150 millimeters above the substrate 100. In effect, activation of the precursor can happen in the gas phase at a substantial distance above the substrate 100. Typically, the pertinent reaction conditions will be uniform or substantially uniform over the entire exposed face of the substrate 100, although certain applications may permit some variation.

In addition to silicon-containing precursors, the environment adjacent the work piece (e.g., substrate 100) can include one or more radical species, preferably in a substantially low energy state. An example of such species includes hydrogen atom radicals. In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, source gas is provided in a carrier gas such as helium. As an example, hydrogen gas may be provided in a helium carrier at a concentration of about 1-10% hydrogen. Pressure, fraction of carrier gas such as helium, and other process conditions are chosen so that the hydrogen atoms encounter the substrate 100 as radicals in a low energy state without recombining.

As explained elsewhere, hydrogen gas may be supplied into a remote plasma source to generate hydrogen atom radicals or hydrogen radicals. Once generated, the hydrogen atom radicals may be in an excited energy state. For example, hydrogen in an excited energy state can have an energy of at least 10.2 eV (first excited state). Excited hydrogen atom radicals may cause unselective decomposition of a silicon-containing precursor. For example, hydrogen atom radicals in an excited state can easily break Si—H, Si—Si, Si—N, Si—O, and Si—C bonds, which can alter the composition or physical or electrical characteristics of the silicon carbide film 101. In some implementations, when the excited hydrogen atom radicals lose their energy, or relax, the excited hydrogen atom radical may become a substantially low energy state hydrogen atom radical or a ground state hydrogen atom radical. Hydrogen atom radicals in a substantially low energy state or ground state can be capable of selectively breaking Si—H and Si—Si bonds while generally preserving Si—O, Si—N, and Si—C bonds. In some implementations, process conditions may be provided so that excited hydrogen atom radicals lose energy or relax to form substantially low energy state or ground state hydrogen atom radicals. For example, the remote plasma source or associated components may be designed so that a residence time of hydrogen atom radicals diffusing from the remote plasma source to the substrate 100 is greater than the energetic relaxation time of an excited hydrogen atom radical. The energetic relaxation time for an excited hydrogen atom radical can be about equal to or less than about $1\times10^{-3}$ seconds.

A state in which a substantial fraction of hydrogen atom radicals are in the ground state can be achieved by various techniques. Some apparatus, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate 100. The process and apparatus may be tuned until substantially no charged species exist near the substrate 100. Additionally, apparatus and process features may be tuned to a configuration where they begin to produce a silicon carbide film 101 from a standard precursor such as trimethylsilane. The relatively mild conditions that support such film deposition are chosen.

Other examples of radical species include oxygen-containing species such as elemental oxygen radicals (atomic or biatomic), nitrogen-containing species such as elemental nitrogen radicals (atomic or biatomic), and N—H containing radicals such as ammonia radicals, where nitrogen is optionally incorporated into the film. Examples of N—H containing radicals include but are not limited to radicals of methylamine, dimethylamine, and aniline. The aforementioned radical species may be produced from a source gas that includes hydrogen, nitrogen, N—H containing species, or mixtures thereof. In some embodiments, substantially all or a substantial fraction of atoms of the deposited film are provided by the precursor molecules. In such cases, the low energy radicals used to drive the deposition reaction may be exclusively hydrogen or other species that does not substantially contribute to the mass of the deposited layer. In some embodiments, as discussed in further detail below, the radical species can be produced by a remote plasma source. In some embodiments, radicals of higher energy state or even ions can potentially be present near the wafer plane.

In some embodiments, the process conditions employ radical species in a substantially low energy state sufficient to break Si—H bonds and/or Si—Si bonds while substantially preserving Si—O, Si—N, and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O, Si—N, and Si—C bonds, which can produce films with undesirable electrical properties (e.g., high dielectric constants and/or low breakdown voltages) and poor conformality. It is believed that an excessively reactive environment produces reactive precursor fragments that have high sticking coefficients (representing a propensity to chemically or physically stick to work piece sidewalls), resulting in poor conformality.

The silicon-containing precursors are typically delivered with other species, notably carrier gas, in the environment adjacent to the substrate 100. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, argon (Ar) and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film 101 at a relatively low concentration. The multiple precursors may be present in equimolar or relatively similar proportions as appropriate to form the primary backbone or matrix in the resulting silicon carbide film 101. In other embodiments, the relative amounts of the different precursors are substantially skewed from equimolarity.

In some embodiments, one or more silicon-containing precursors provide essentially all of the mass of the deposited silicon carbide film 101, with small amounts of hydrogen or other element from a remote plasma providing less than about 5% atomic or less than about 2% atomic of the film mass. In some embodiments, only the radical species and one or more silicon-containing precursors contribute to the composition of the deposited silicon carbide film 101. In other embodiments, the deposition reaction includes a co-reactant other than one or more silicon-containing precursors and the radical species. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), and combinations thereof. Such materials may be used as nitriding agents, oxidizers, reductants, etc. In some cases, they can be used to tune the amount of carbon in the deposited film by removing a fraction of the carbon provided with the silicon-containing precursor. In some implementations employing a non-hydrogen co-reactant, the co-reactant is introduced to the reaction chamber via the same flow path as the silicon-containing precursor; e.g., a path including a showerhead, typically without direct exposure to plasma. In some embodiments, oxygen and/or carbon dioxide is introduced with the precursor to alter the composition of the silicon carbide film 101 by removing carbon from the film or precursor during deposition. In some implementations employing a non-hydrogen co-reactant, the co-reactant is introduced to the reaction chamber via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film 101.

In certain embodiments where co-reactants are used and they are introduced to the chamber with the species being converted to radicals (e.g., hydrogen), they may be provided to the reaction chamber in relatively small amounts in comparison to the other gases in the reaction chamber, including the source of radicals (e.g., hydrogen) and any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10-20 liters per minute (L/m) He, about 200-500 standard cubic centimeters per minute (sccm) H2, and about 1-10 sccm oxygen. When the co-reactants are introduced to the reaction chamber along with the silicon-containing precursor (e.g., through a showerhead), they may be present at a higher concentration; for example about 2% or less or about 0.1% or less. When the co-reactant is a relatively weak reactant (e.g., a weak oxidant such as carbon dioxide), it may be present at even higher concentrations, such as about 10% or less or about 4% or less.

The temperature in the environment adjacent to the substrate 100 can be any suitable temperature facilitating the deposition reaction, but sometimes limited by the application of the device containing the silicon carbide film 101. In some embodiments, the temperature in the environment adjacent to the substrate 100 can be largely controlled by the temperature of a pedestal on which a substrate 100 is supported during deposition of the silicon carbide film 101. In some embodiments, the operating temperature can be between about 50° C. and about 500° C. For example, the operating temperature can be between about 250° C. and about 400° C. in many integrated circuit applications. In some embodiments, increasing the temperature can lead to increased cross-linking on the substrate surface.

The pressure in the environment adjacent to the substrate 100 can be any suitable pressure to produce reactive radicals in a reaction chamber. In some embodiments, the pressure can be about 35 Torr or lower. For example, the pressure can be between about 10 Torr and about 20 Torr, such as in embodiments implementing a microwave generated plasma. In other examples, the pressure can be less than about 5 Torr, or between about 0.2 Torr and about 5 Torr, such as in embodiments implementing a radio-frequency (RF) generated plasma.

FIGS. 1B-1D illustrate cross-sections of structures containing silicon carbide films in a variety of applications. FIG. 1B illustrates silicon carbide vertical structures on the sidewalls of a gate electrode structure of a transistor. FIG. 1C illustrates silicon carbide vertical structures on exposed sidewalls of copper lines in an air gap type metallization layer. FIG. 1D illustrates silicon carbide pore sealants for porous dielectric materials. Each of these applications is discussed in further detail below.

Chemical Structure of Precursors

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—$NR_1R_2$) groups, wherein $R_1$ and $R_2$ are independently hydrogen or organic groups.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into a silicon carbide film, with the size of the pores corresponding to the radius of the ring. For example, a cyclotetrasiloxane ring can have a radius of about 6.7 Å.

Figure 2:
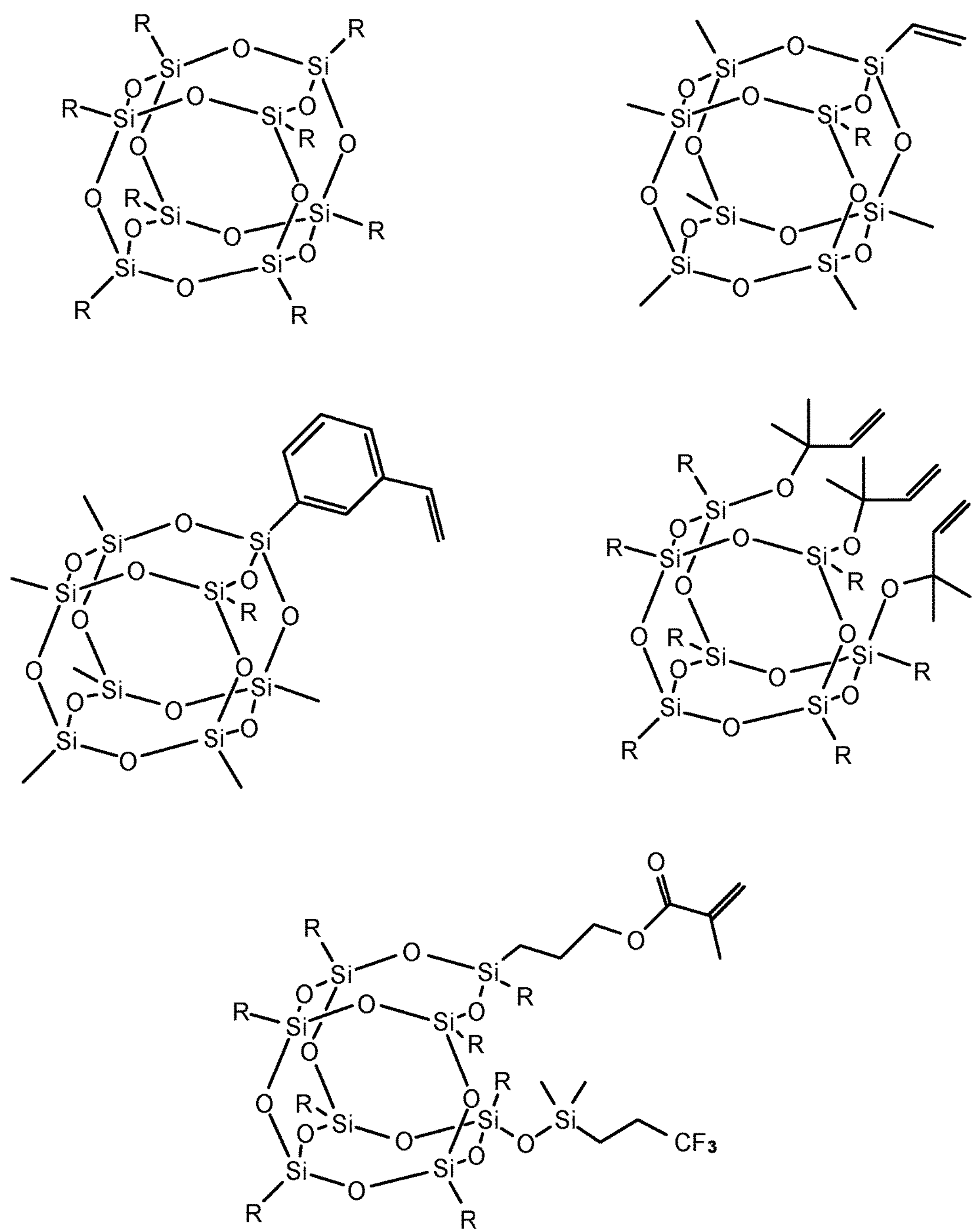
FIG. 2 illustrates examples of representative caged siloxane precursors.

In some embodiments, the siloxane may have a three-dimensional or caged structure. FIG. 2 illustrates examples of representative caged siloxane precursors. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into a silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane ($(CH_3)_2Si—CH_2—Si(CH_3)_3$), and dimethylsilane (2MS).

In some embodiments, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

In some embodiments, the silicon-containing precursor can be a nitrogen-containing compound such as a silicon-nitrogen hydride (e.g., a silazane). Generally, such compounds contain carbon, but only bonded to silicon atoms, and not to nitrogen atoms. In certain embodiments, the nitrogen-containing compound does not have any carbon-nitrogen bonds. In certain embodiments, the nitrogen-containing compound does not have any amine moieties (—C—$NR_1R_2$), where $R_1$ and $R_2$ are the same or different groups such hydrogen atoms and hydrocarbon groups such as alkyl groups, alkene groups, or alkyne groups. Examples of suitable silicon-nitrogen precursors include various silazanes such as cyclic and linear silazanes containing one or more hydrocarbon moieties bonded to one or more silicon atoms and one or more hydrogen atoms bonded to one or more silicon atoms. Examples of silazanes include methyl-substituted disilazanes and trisilazanes, such as tetramethyldisilazane and hexamethyl trisilazane.

In depositing silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film. For example, the amount of siloxane can be greater than the amount of silane in molar percentages to produce a porous film as discussed in more detail below.

For depositing oxygen doped silicon carbide films, examples of suitable precursors include cyclic siloxanes such as cyclotetrasiloxanes such as heptamethylcyclotetrasiloxane (HMCTS) and tetramethylcyclotetrasiloxane. Other cyclic siloxanes can also include but are not limited to cyclotrisiloxanes and cyclopentasiloxanes. For depositing oxygen doped silicon carbide films, other examples of suitable precursors include linear siloxanes such as, but not limited to, disiloxanes, such as pentamethyldisiloxane (PMDSO), tetramethyldisiloxane (TMDSO), hexamethyl trisiloxane, and heptamethyl trisiloxane.

As explained, silicon-containing precursors are chosen to provide highly conformal silicon carbide films. It is believed that silicon-containing precursors having low sticking coefficients are capable of producing highly conformal films. "Sticking coefficient" is a term used to describe the ratio of the number of adsorbate species (e.g., fragments or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. In some cases, the sticking coefficient of the precursors (at the relevant deposition conditions) may be about 0.05 or less, for example about 0.001 or less.

Densified Silicon Carbide Film

Technology nodes are continually shrinking in the integrated circuit manufacturing industry. With each technology node, device geometries shrink and pitch becomes smaller. High aspect ratio gaps in such technology nodes may need to be filled with insulating material, such as insulating material with a low dielectric constant (low-k). Semiconductor integration operations may involve filling high aspect ratio gaps with low-k dielectric materials. This is the case for shallow trench isolation, inter-metal dielectric layers, passivation layers, and the like.

For example, going from a 45-nm technology node to a 14-nm technology node, device features shrink laterally so that conductive materials get closer and closer. Unwanted conductive coupling may occur as conductive materials get closer and closer, which can lead to parasitic capacitance, delay in signal propagation, and signal crosstalk due to capacitive effects. However, as technology nodes become smaller, low-k materials as the interlayer dielectric (ILD) of conductive interconnects can reduce parasitic capacitance, signal delay, and signal crosstalk. Some applications, including fin field effect transistor (finFET) structures and dynamic random-access memory (DRAM) bit structures, require low-k materials as sidewall spacer materials.

Silicon nitride ($Si_3N_4$) is often used as an insulating material in many integrated circuit applications because of its step coverage, thermal stability, etch-ability and etch resistance, and high breakdown voltages. However, the dielectric constant of silicon nitride, which is about 7-8, may be too high as technology nodes become smaller.

Silicon oxide ($SiO_2$) has a lower dielectric constant, which is about 4.0, and can provide a significant reduction in capacitance as an interlayer dielectric of conductive interconnects. However, silicon oxide may not have sufficient resistance or selectivity to etching operations in various device integration operations.

Silicon carbide materials, including doped and undoped silicon carbide materials, may serve as insulating materials in integrated circuit applications that provide not only a low dielectric constant, but also step coverage, thermal stability, wet etch resistance, dry etch selectivity to oxide/nitride, and high breakdown voltages. For example, incorporation of oxygen atoms and/or nitrogen atoms may tune the properties of silicon carbide materials. In some embodiments, an oxygen doped silicon carbide film can serve as an insulating material in integrated circuit applications that provides a low dielectric constant, wet etch resistance to survive device integration operations, and dry etch selectivity to oxide/nitride.

Various techniques for densifying a thin film may improve the properties of the thin film. Densification of materials are typically accomplished using thermal anneal treatments and direct plasma treatments. Direct plasma treatments or PECVD treatments may densify a thin film by ion bombardment, where the direct plasma or PECVD treatment may use an inert gas species or a reactive gas species such as ammonia ($NH_3$), nitrogen ($N_2$), or oxygen ($O_2$). Ion bombardment with a reactive gas species may convert one or more elements in a thin film, such as carbon in a silicon carbide film, nitrogen in a silicon nitride film, or oxygen in a silicon oxide film. An $NH_3$ plasma may be used, for example, to densify an SiCN film. Ions and radicals from the $NH_3$ plasma contribute to the film densification, but ion damage may occur during the direct plasma treatment. Also, film densification may not be uniform with direct plasma treatment of film deposited in features (e.g., trenches, recesses, etc.), where film densification may be greater at the top and bottom of a feature than at the sidewalls of the feature.

Silicon carbide films may undergo one or more device integration operations when manufacturing an integrated circuit. Such device integration operations may include various deposition, etching, cleaning/stripping, and annealing processes. In device integration operations, the silicon carbide films may undergo processes of etching, ashing, and/or annealing. For example, the silicon carbide films may undergo one or more processes of wet etching, dry etching of $SiO_2$, oxygen plasma ashing of photoresist, and steam annealing. Accordingly, it may be desirable to develop silicon carbide films with improved chemical stability, improved dry etch selectivity over $SiO_2$, improved plasma resistance to ashing, and improved thermal stability. Densified silicon carbide films may provide at least some of the aforementioned improvements if not all of the aforementioned improvements.

Figure 4A:
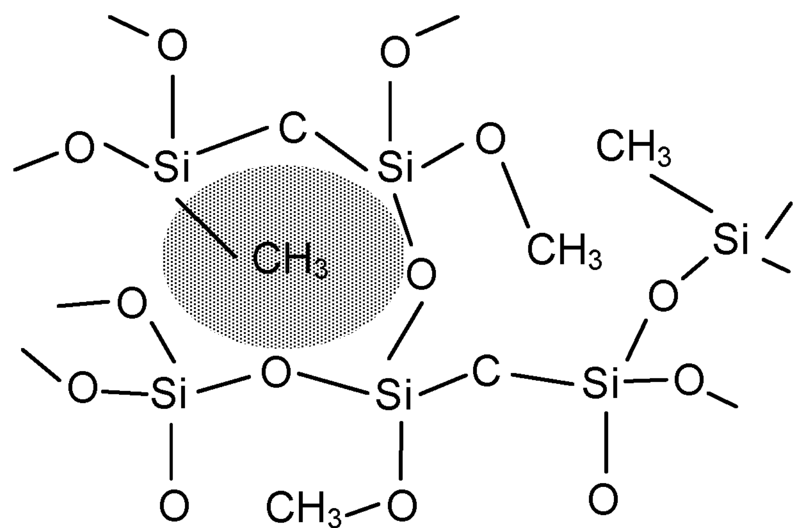
FIG. 4A shows an example of a chemical structure of oxygen doped silicon carbide prior to densification.

Densified silicon carbide films possess greater bond density of Si—C and/or Si—O bonds than undensified silicon carbide films. Densification may remove dangling silicon and/or carbon bonds and promote cross-linking of silicon and/or carbon atoms. Typically, a chemical structure of a deposited silicon carbide film may include several terminal methyl groups ($CH_3$) and increased hydrogen content. By way of an example, an oxygen doped silicon carbide film prior to densification may contain several terminal $CH_3$ bonds and may possess high hydrogen content. Hydrogen atoms may be bonded to oxygen atoms to form silanols (Si—OH), and hydrogen atoms may be bonded to silicon atoms to form terminal Si—H bonds. FIG. 4A shows an example of a chemical structure of oxygen doped silicon carbide prior to densification. As shown in FIG. 4A, the oxygen doped silicon carbide structure includes multiple terminal $CH_3$ bonds, where carbon atoms are coordinated by oxygen and hydrogen atoms. Many of the carbon atoms, or at least a substantial fraction of the carbon atoms, are not cross-linked.

Figure 4B:
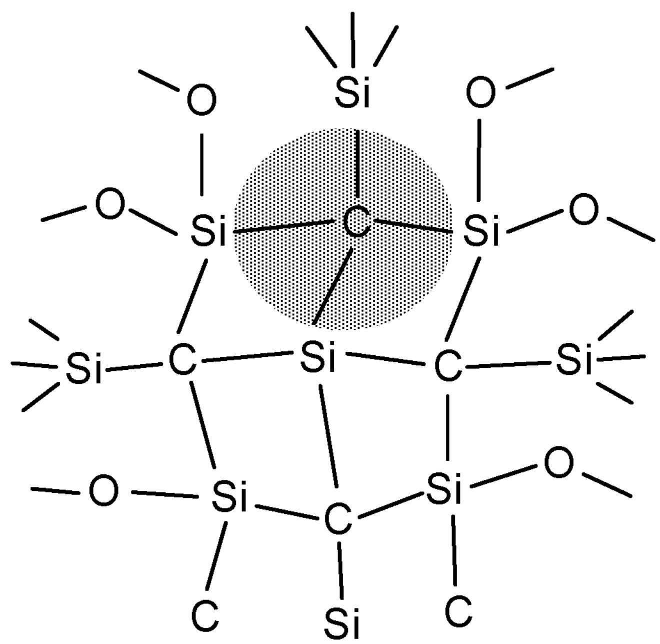
FIG. 4B shows an example of a chemical structure of oxygen doped silicon carbide after densification.

Remote plasma treatment of a silicon carbide film may increase the bond density of Si—C bonds and decrease the number of terminal $CH_3$ bonds and Si—H bonds, thereby densifying the silicon carbide film. The remote plasma treatment may remove hydrogen atoms from the terminal $CH_3$ bonds and Si—H bonds and promote cross-linking to form at least Si—C bonds. Si—Si bonds may also be formed by cross-linking. Hydrogen from Si—$CH_3$ groups may be removed during treatment and cross-link to form Si—C—Si bonds. In some implementations where an oxygen doped silicon carbide film is deposited, densification increases the bond density of Si—O and Si—C bonds by removal of terminal $CH_3$ bonds, Si—OH bonds, and Si—H bonds. Remote plasma treatment may extract hydrogen from the oxygen doped silicon carbide film and promote cross-linking so that more Si—O and Si—C bonds may be formed. Hydrogen from Si—$CH_3$ groups may be removed during treatment and cross-link to form Si—C—Si bonds. Hydrogen from Si—OH groups and Si—H groups may be removed during treatment and such groups may cross-link to form Si—O—Si bonds. Furthermore, remote plasma treatment may cause hydroxyls of Si—OH groups to react to form water ($H_2O$) and cross-link with each other to form Si—O—Si bonds. It will be understood that remote plasma treatment may lead to other possible mechanisms or other possible reaction pathways for increasing the bond density of Si—O and Si—C bonds and decreasing the amount of terminal $CH_3$ bonds, Si—OH bonds, and Si—H bonds. FIG. 4B shows an example of a chemical structure of oxygen doped silicon carbide after densification. As shown in FIG. 4B, the oxygen doped silicon carbide film includes little to no $CH_3$ bonds, where carbon atoms are generally cross-linked and coordinated by silicon atoms. The carbon atoms, or at least a substantial fraction of the carbon atoms, are cross-linked and not coordinated by hydrogen or oxygen atoms.

Without being limited by any theory, the increased Si—C bond density may improve certain properties of a silicon carbide film. In some embodiments, increased Si—C and Si—O bond density may improve certain properties of an oxygen doped silicon carbide film. A doped or undoped silicon carbide film may have greater chemical and thermal stability after densification. For example, a doped or undoped silicon carbide film after densification may exhibit one or more properties of a low etch rate, high etch selectivity over silicon oxide, high $O_2$ plasma ash resistance, and high thermal stability.

The present disclosure may densify a silicon carbide film using a remote plasma treatment and, in certain embodiments, a remote hydrogen plasma treatment. It will be understood that silicon carbide films of the present disclosure includes undoped silicon carbide films and doped silicon carbide films, such as silicon oxycarbide (SiCO) films, silicon nitricarbide (SiCN) films, and silicon oxynitricarbide (SiONC) films. The densified silicon carbide film may exhibit improved chemical stability, thermal stability, resistance to etching, selectivity over oxide/nitride, and resistance to plasma ashing. In some embodiments, the silicon carbide film is densified in a layer-by-layer approach. Film density and composition of the silicon carbide film across a thickness of the film may be controlled in a layer-by-layer process. Densification of the silicon carbide film using remote plasma treatment in a layer-by-layer approach provides a more uniform film densification while minimizing damage that otherwise may be caused from ion bombardment in a direct plasma treatment.

FIGS. 5A-5D illustrate various stages of depositing and densifying a silicon carbide film on a substrate. Deposition and remote plasma treatment cycles may occur in alternating fashion to form the densified silicon carbide film. The operations shown in FIGS. 5A-5D may be performed with different, fewer, or additional operations.

Figure 5A:
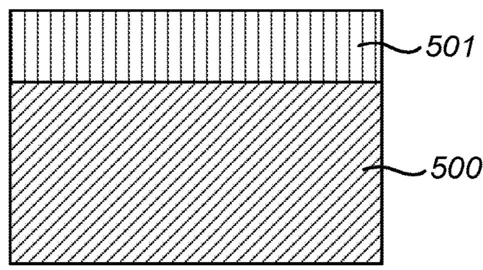
FIGS. 5A-5D illustrate various stages of depositing and densifying a silicon carbide film on a substrate.

FIG. 5A illustrates a cross-section of an example silicon carbide film deposited over a substrate. A first thickness 501 of a silicon carbide film can be deposited on a substrate 500. The substrate 500 can be any wafer, semiconductor wafer, partially fabricated integrated circuit, printed circuit board, display screen, or other appropriate workpiece. In some embodiments, the substrate 500 may include a plurality of high aspect ratio features, where each of the features may have a depth to width aspect ratio of greater than 2:1, greater than 5:1, or greater than 10:1. The first thickness 501 of the silicon carbide film may be deposited in such high aspect ratio features with good step coverage. Good step coverage can be useful in a variety of integrated circuit applications, such as in sidewall spacer applications.

The first thickness 501 of the silicon carbide film can be controlled according to a predetermined deposition time to achieve a desired thickness. In some embodiments, the deposition time can be between about 5 seconds and about 500 seconds, or between about 10 seconds and about 200 seconds. In some embodiments, a desired thickness of the first thickness 501 can be between about 5 Å and about 30

Å. The deposition time can correspond to the desired thickness of the first thickness 501. The first thickness 501 can be controlled to enable sufficient penetration of a subsequent remote plasma treatment to densify the first thickness 501.

Deposition of the first thickness 501 of the silicon carbide film can occur using a remote plasma deposition technique described earlier herein. In some embodiments, the first thickness 501 is deposited by flowing one or more silicon-containing precursors into a reaction chamber towards the substrate 500, and flowing one or more radicals of a source gas from a remote plasma source to react with the one or more silicon-containing precursors for a first time period (e.g., deposition time). The radicals of the source gas may be in a low energy state or ground state upon reacting with the one or more silicon-containing precursors. The reaction with the one or more silicon-containing precursors provides relatively mild process conditions in an environment adjacent to the substrate 500.

In some embodiments, the radicals may be produced from a source gas that includes hydrogen, nitrogen, N—H containing species such as $NH_3$, oxygen, oxygen-containing species such as $H_2O$, $CO_2$, or $N_2O$, or mixtures thereof. For example, the source gas can include hydrogen. A substantial fraction of the radicals may be radicals in a substantially low energy state, such as the ground state. Hydrogen radicals in a substantially low energy state or ground state can be capable of selectively breaking Si—H and Si—Si bonds while generally preserving Si—O, Si—N, and Si—C bonds. In some embodiments, at least 90% of the radicals of the source gas are hydrogen radicals in the ground state. A state in which a substantial fraction of hydrogen radicals are in the substantially low energy state or ground state can be achieved by various techniques. Some apparatus, such as described below, are designed to achieve this state.

Process conditions as described earlier may apply for depositing a silicon carbide film using remote plasma deposition with one or more silicon-containing precursors. Process conditions such as pressure, temperature, RF power, gas flow, and gas composition can be tuned during deposition to influence the characteristics of the remote plasma.

In some embodiments, the pressure in the environment adjacent to the substrate 500 can be any suitable pressure to produce reactive radicals in a reaction chamber. For example, the pressure can be about 35 Torr or lower, such as between about 10 Torr and about 20 Torr or between about 0.2 Torr and about 5 Torr.

In some embodiments, the temperature in the environment adjacent to the substrate 500 can be any suitable temperature to facilitate deposition. For example, the temperature can be between about 50° C. and about 500° C. or between about 250° C. and about 400° C.

In some embodiments, the RF power applied to the remote plasma source can vary depending on the type of plasma source, wafer size, and other operating conditions. Typically, for example, RF power for an inductively-coupled plasma for a 300-mm wafer can be between about 300 Watts and about 10 Kilowatts, or between about 1 Kilowatt and about 6 Kilowatts. Higher RF power may be applied to generate more radicals in the remote plasma source.

In some embodiments, the gas composition during remote hydrogen plasma deposition can include one or more silicon-containing precursors. Each of the one or more silicon-containing precursors includes at least one Si—H and/or at least one Si—Si bond. In addition, each of the silicon-containing precursors may further include at least one Si—O bond, at least one Si—N bond, and/or at least one Si—C bond. In some implementations, each of the silicon-containing precursors include no O—C or N—C bonds; e.g., the precursor(s) contain no alkoxy (—O—R), where R is an organic group such as a hydrocarbon group, or amine (—$NR_1R_2$) groups, wherein $R_1$ and $R_2$ are independently hydrogen or organic groups. The one or more silicon-containing precursors may be selected to tune the composition of the silicon carbide film and achieve high step coverage. In some implementations, each of the one or more silicon-containing precursors is selected from a group consisting of: a cyclic siloxane, a linear siloxane, an alkoxy silane, an alkyl silane, and a silazane. For example, the one or more silicon-containing precursors can include an alkylcarbosilane, a linear siloxane, a cyclic siloxane, a silazane, or any combination thereof when forming a silicon carbide film, an oxygen doped silicon carbide film, a nitrogen doped silicon carbide film, or an oxygen and nitrogen doped silicon carbide film. The one or more silicon-containing precursors can provide essentially all of the mass of the deposited first thickness 501 of the silicon carbide film, with small amounts of hydrogen or other element from a remote plasma providing less than about 5% atomic or less than about 2% atomic of the film mass.

In some embodiments, the gas composition during remote hydrogen plasma deposition can include one or more co-reactants in addition to the one or more silicon-containing precursors. The one or more co-reactants may be introduced to the reaction chamber via the same flow path as the silicon-containing precursors where the one or more co-reactants are not exposed to plasma, or the one or more co-reactants may be introduced to the reaction chamber via the same flow path as the remote plasma where the one or more co-reactants are exposed to plasma. The co-reactant may be selected to tune the composition of the first thickness 501 of the silicon carbide film. Depending on the choice of the co-reactant, the co-reactant may increase or decrease the carbon, oxygen, or nitrogen content of the silicon carbide film. The co-reactant may include $CO_2$, CO, $H_2O$, $CH_3OH$, $O_2$, $O_3$, $N_2$, $N_2O$, $NH_3$, $N_2H_2$, $CH_4$, $C_2H_6$, $C_2H_2$, $C_2H_4$, $B_2H_6$, or combinations thereof. In some instances, the one or more co-reactants may include $CO_2$, $O_2$, $N_2$, $NH_3$, or combinations thereof. The one or more co-reactants may be introduced to the reaction chamber in relatively small amounts compared to other gases in the reaction chamber, including the source gas of radicals and any carrier gases.

In some embodiments, the gas composition during remote plasma deposition can include one or more carrier gases. In particular, the source gas may be provided with a carrier gas. Examples of carrier gases include, but are not limited to, helium, neon, argon, krypton, and xenon. The concentration of carrier gas can be substantially greater than the concentration of the source gas. As an example, hydrogen gas may be provided in a helium carrier gas at a concentration of about 1-10% hydrogen. The presence of the carrier gas can contribute to increased ionization of the source gas and reduced recombination. Though lower pressure typically facilitates increased ionization of the source gas and reduced recombination, the presence of the carrier gas can serve the same effect. That way, even at a higher pressure, a substantial fraction of radicals may be generated with minimal recombination when a carrier gas such as helium is flowed with the source gas. Higher pressure in the reaction chamber during deposition may improve the conformality of the silicon carbide film. Higher pressure in the reaction chamber may correspond to a pressure greater than about 3 Torr or greater than about 5 Torr, such as about 7 Torr.

It will be understood that the composition of the silicon carbide film can vary depending on the choice of the precursor, the flow of the precursor, and the flow of co-reactant. In some embodiments, the internal structure of the precursor is maintained in the deposited film. This structure may preserve all or most of the Si—C, and Si—O and/or Si—N bonds, if present, in the precursor, while linking or cross-linking individual precursor moieties through bonds at locations where Si—H bonds and/or Si—Si bonds existed in the precursor molecules and/or through additional condensation reactions on the growing surface if sufficient thermal energy is provided.

Figure 5B:
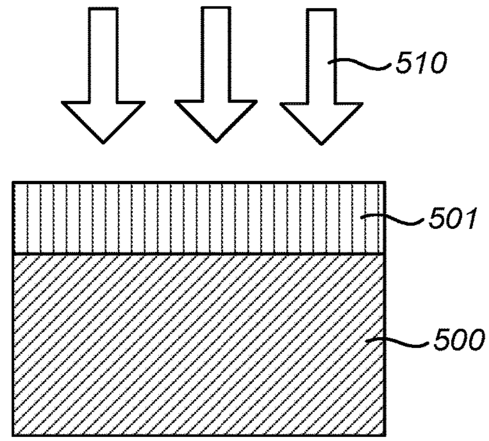

FIG. 5B illustrates a cross-section of the silicon carbide film of FIG. 5A densified by a remote plasma treatment. After the first thickness 501 of the silicon carbide film is deposited on the substrate 500, the first thickness 501 is exposed to a remote plasma treatment 510 to densify the first thickness 501. A remote plasma source for generating radicals of a source gas during deposition may also serve to generate radicals of the source gas during treatment. Accordingly, silicon carbide film deposition may occur in the same reaction chamber as silicon carbide film treatment. This allows alternating deposition and treatment cycles to be performed in the same tool. As a result, depositing the first thickness 501 and exposing the first thickness 501 of the silicon carbide film to the remote plasma treatment 510 can occur without introducing a vacuum break (e.g., air break). A vacuum break can reduce throughput and introduce oxidation into the semiconductor device, which can lead to higher electrical resistance and decreased performance.

Densification of the first thickness 501 of the silicon carbide film can be accomplished by the remote plasma treatment 510. Exposing the first thickness 501 of the silicon carbide film to the remote plasma treatment 510 can include flowing a source gas into the remote plasma source, generating, from the source gas, radicals of the source gas in the remote plasma source, and flowing the radicals of the source gas to the first thickness 501 of the silicon carbide film. In some embodiments, exposing the first thickness 501 of the silicon carbide film to the remote plasma treatment 510 further includes flowing an inert gas with the source gas. In some embodiments, the source gas can include hydrogen, nitrogen, N—H containing species such as $NH_3$, oxygen, oxygen-containing species such as $H_2O$, $CO_2$, or $N_2O$, or mixtures thereof. For example, the source gas can include hydrogen.

Exposing the first thickness 501 of the silicon carbide film to the remote plasma treatment 510 occurs without delivery of silicon-containing precursors. In other words, while deposition of the first thickness 501 of silicon carbide film involves flowing one or more silicon-containing precursors, treatment of the first thickness 501 of the silicon carbide film ceases the flow of silicon-containing precursors. However, the remote plasma treatment 510 can treat the first thickness 501 of the silicon carbide film by delivery of radicals in a substantially low energy state to the first thickness 501 of the silicon carbide film. A substantial fraction of the radicals may be in radicals in a substantially low energy state, such as the ground state. In some embodiments, at least 90% of the radicals of the source gas are hydrogen radicals in the ground state. During the remote plasma treatment 510, the radicals of the source gas may be flowed to the first thickness 501 of the silicon carbide film in addition to other gases, such as one or more co-reactant gases and an inert carrier gas. The remote plasma treatment 510 may remove hydrogen to from Si—$CH_3$ groups, Si—OH groups, and Si—H groups in the silicon carbide film and promote cross-linking to increase overall bond density of Si—C and/or Si—O bonds.

Densification of the first thickness 501 of the silicon carbide film using the remote plasma treatment 510 can be controlled according to a predetermined treatment time. In some embodiments, the treatment time can be between about 2 seconds and about 100 seconds, or between about 5 seconds and about 50 seconds. Longer treatment times can correspond to increased densification. Determination of the treatment time can depend on the thickness of the first thickness 501, where thicker layers may require longer treatment times to more fully densify the layer.

In addition to treatment time, densification and treatment efficiency may be controlled by tuning one or more process conditions such as pressure, RF power, gas flow, and gas composition. Pressure, RF power, gas flow, gas composition, and other process conditions may be tuned during the remote plasma treatment 510 to influence the characteristics of the remote plasma, which can thereby result in different bond density in the first thickness 501 of the silicon carbide film.

The pressure in the reaction chamber during the remote plasma treatment 510 can be adjusted to increase ionization of the source gas and reduce residence times of the radicals of the source gas. Reduced residence times will reduce the effects of recombination of the radicals. A lower pressure allows molecules to move faster, which results in increased ionization of the source gas, reduced residence times, and reduced recombination of radicals. In some embodiments, the pressure can be between about 0.2 Torr and about 5 Torr, or between about 1 Torr and about 3 Torr. However, it will be understood that the pressure in the reaction chamber during the remote plasma treatment 510 can be greater than 3 Torr or greater than 5 Torr where other process conditions (e.g., inert carrier gas) cause sufficient ionization and reduced residence times.

The RF power applied to the remote plasma source during the remote plasma treatment 510 can be adjusted to increase generation of radicals of the source gas. Increased RF power will increase ionization of the source gas, thereby creating a substantial fraction of radicals of the source gas. Typically, for example, RF power for an inductively-coupled plasma for a 300-mm wafer can be between about 300 Watts and about 10 Kilowatts, or between about 1 Kilowatt and about 6 Kilowatts.

The source gas may be flowed with an inert carrier gas during the remote plasma treatment 510. An inert carrier gas can include, but is not limited to, helium, neon, argon, krypton, and xenon. The concentration of the inert carrier gas can be substantially greater than the concentration of the source gas. In some embodiments, the concentration of the source gas relative to the inert carrier gas can be between about 1% and about 10%, or between about 2% and about 5%. Without being limited by any theory, the reason for having a substantially greater concentration of inert carrier gas relative to the source gas is that the inert carrier gas contributes to "penning ionization," causing significant dissociation of the source gas and generating a substantial fraction of radicals. The substantially greater concentration of inert carrier gas can also minimize recombination of the radicals. As an example, hydrogen gas may be provided in a helium carrier gas at a concentration of about 1-10% hydrogen. Inert carrier gases with lower molecular weight, such as helium, may contribute to penning ionization with greater efficiency than inert carrier gases with higher molecular weight. Furthermore, flowing an inert carrier gas with a low molecular weight (e.g., helium) and a low concentration of source gas relative to inert carrier gas (e.g., small amounts of hydrogen in helium at a concentration of about 1-10% hydrogen) can produce a substantial fraction of radicals even at high pressures (e.g., greater than 3 Torr) while minimizing recombination. Thus, the presence of a suitable inert carrier gas at an appropriate concentration can help densify the first thickness 501 of the silicon carbide film regardless of the pressure of the reaction chamber.

One or more co-reactants may be flowed during the remote plasma treatment 510 to tune the bond density and composition of the first thickness 501 of the silicon carbide film. The one or more co-reactants may be introduced to the reaction chamber via the same flow path as the remote plasma, where the one or more co-reactants are exposed to plasma. Depending on the choice of the co-reactant, the co-reactant may increase or decrease the oxygen, nitrogen, or carbon content of the silicon carbide film. The co-reactant may include $CO_2$, CO, $H_2O$, $CH_3OH$, $O_2$, $O_3$, $N_2$, $N_2O$, $NH_3$, $N_2H_2$, $CH_4$, $C_2H_6$, $C_2H_2$, $C_2H_4$, $B_2H_6$, or combinations thereof. In some instances, the one or more co-reactants may include $CO_2$, $O_2$, $N_2$, $NH_3$, or combinations thereof. The presence of oxygen gas or oxygen radicals tends to extract carbon from Si—C bonds. In other words, the presence of oxygen can convert carbide to oxide. Carbon can be removed from a silicon-containing precursor on the substrate and, in some instances, can be replaced with oxygen. Therefore, increasing a concentration of oxygen in the remote plasma during the remote plasma treatment 510 can effectively tune the carbon content of the first thickness 501 of the silicon carbide film. In addition or in the alternative, the presence of nitrogen gas or nitrogen radicals tends to extract carbon from Si—C bonds. Therefore, increasing a concentration of nitrogen in the remote plasma during the remote plasma treatment 510 can effectively tune the carbon content of the first thickness 501 of the silicon carbide film.

Figure 5C:
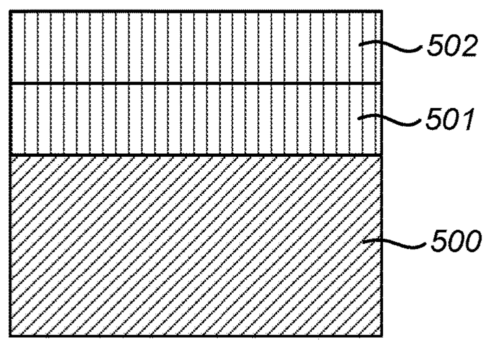

FIG. 5C illustrates a cross-section of the silicon carbide film of FIG. 5B with a second thickness deposited over the first thickness of the silicon carbide film. A second thickness 502 of the silicon carbide film can be deposited on the first thickness 501 of the silicon carbide film. Operations for depositing the second thickness 502 can be identical or at least similar to the operations for depositing the first thickness 501. Put another way, the process for depositing the second thickness 502 can repeat the process for depositing the first thickness 501. For example, where depositing the first thickness 501 includes flowing one or more silicon-containing precursors into a reaction chamber and flowing one or more radicals of a source gas generated from a remote plasma source to react with the one or more silicon-containing precursors for a first time period, depositing the second thickness 502 includes repeating the aforementioned operations for a second time period. In some embodiments, the first time period is identical to the second time period. In some embodiments, the first time period is different than the second time period. A different time period may correspond to a different thickness. In some embodiments, a thickness of the second thickness 502 can be between about 5 Å and about 30 Å. Moreover, controlling the deposition time and various process conditions such as pressure, temperature, RF power, gas flow, and gas composition can tune the thickness and composition of the second thickness 502 of the silicon carbide film. Accordingly, deposition time, pressure, temperature, RF power, gas flow, and gas composition for depositing the second thickness 502 of the silicon carbide film may be the same or different than the deposition time, pressure, temperature, RF power, gas flow, and gas composition for depositing the first thickness 501 of the silicon carbide film.

Figure 5D:
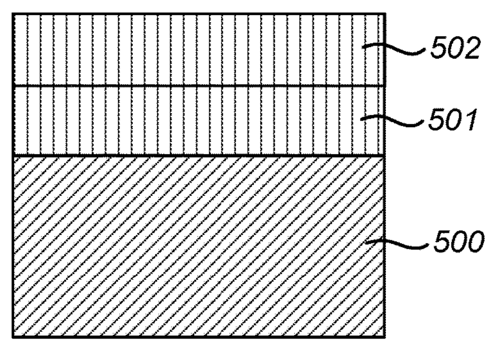

FIG. 5D illustrates a cross-section of the silicon carbide film of FIG. 5C densified by a remote plasma treatment. After the second thickness 502 of the silicon carbide film is deposited on the first thickness 501, the second thickness 502 is exposed to a remote plasma treatment 520 to densify at least the second thickness 502. Operations for exposing the second thickness 502 to the remote plasma treatment 520 can be identical or at least similar to the operations for exposing the first thickness 501 to the remote plasma treatment 510. In other words, the process for exposing the second thickness 502 to the remote plasma treatment 520 can repeat the process for exposing the first thickness 501 to the remote plasma treatment 510. For example, where exposing the first thickness 501 to the remote plasma treatment 510 includes flowing a source gas into the remote plasma source, generating, from the source gas, radicals of the source gas in the remote plasma source, and flowing the radicals of the source gas to the first thickness 501 of the silicon carbide film, exposing the second thickness 502 to the remote plasma treatment 520 includes repeating the aforementioned operations on the second thickness 502 of the silicon carbide film. In some embodiments, the treatment times are identical. In some embodiments, the treatment times are different. The treatment time may be sufficient for the remote plasma to penetrate the second thickness 502 of the silicon carbide film. Different treatment times can lead to a silicon carbide film with a density gradient across the thickness of the film. In addition, controlling the treatment time and various process conditions such as pressure, RF power, gas flow, and gas composition can change the treatment efficiency and densification of the second thickness 502 of the silicon carbide film. Accordingly, treatment time, pressure, RF power, gas flow, and gas composition for the remote plasma treatment 520 may be the same or different than the treatment time, pressure, RF power, gas flow, and gas composition for the remote plasma treatment 510.

With reference to FIGS. 5A-5D, deposition and densification of a doped or undoped silicon carbide film can be achieved with alternating deposition and treatment cycles. Deposition and densification occur in a layer-by-layer approach to allow for each remote plasma treatment cycle to fully densify the deposited layer. That way, the entire film stack can be densified and have a more uniform film density across the thickness of the film stack. Therefore, it will be understood that deposition and treatment cycles in the formation of a silicon carbide film is not limited to the operations shown in FIGS. 5A-5D, but may continue to repeat until a desired film thickness is achieved. The densified silicon carbide film of the present disclosure can be implemented in a variety of applications, including in structures shown in FIGS. 1B-1D, which is discussed in further detail below.

Densification of a silicon carbide film in a layer-by-layer approach can yield greater overall bond density compared to densification of a silicon carbide film without a layer-by-layer approach. A remote plasma treatment can densify a silicon carbide film by removing hydrogen atoms from Si—$CH_3$, Si—OH, and/or Si—H groups, and promoting cross-linking in the chemical structure of the silicon carbide film. A remote plasma treatment can densify the silicon carbide film by increasing the bond density of Si—C bonds and decreasing the number of terminal $CH_3$ bonds and Si—H bonds. In some embodiments involving an oxygen doped silicon carbide film, the remote plasma treatment can densify the oxygen doped silicon carbide film by increasing the bond density of Si—C and Si—O bonds and decreasing the number of terminal $CH_3$ bonds, Si—OH bonds, and Si—H bonds.

The process conditions for forming a densified silicon carbide film can provide a film structure that is highly conformal. The relatively mild process conditions during deposition and treatment can minimize the degree of ion bombardment at the surface of the substrate so that the deposition and treatment are isotropic. Moreover, the relatively mild process conditions can reduce the number of radicals with high sticking coefficients that would have a tendency to stick to the sidewalls of previously deposited layers or films. In certain embodiments, for depth-to-width aspect ratios of about 2:1 to 10:1, the densified silicon carbide film may be deposited with a conformality of between about 25% and 100%, more typically between about 50% and 100%, and even more typically between about 80% and 100%. Conformality may be calculated by comparing the average thickness of a deposited film on a bottom, sidewall, or top of a feature to the average thickness of a deposited film on a bottom, sidewall, or top of a feature. For example, conformality may be calculated by dividing the average thickness of the deposited film on the sidewall by the average thickness of the deposited film at the top of the feature and multiplying it by 100 to obtain a percentage. For certain applications, a conformality of between about 85% and 95% is sufficient. In some examples, forming densified silicon carbide on features having an aspect ratio of between about 2:1 and about 4:1, the conformality is at least about 90%. Certain BEOL (back end of line) processes fall into this category. In some examples, forming densified silicon carbide on features having an aspect ratio of between about 4:1 and about 6:1, the conformality is at least about 80%. Certain spacer deposition processes fall into this category. In some examples, forming densified silicon carbide on features having an aspect ratio of between about 7:1 and about 10:1 (and even higher), the conformality is at least about 90%. Certain DRAM fabrication processes fall into this category.

The process conditions for forming a densified silicon carbide film can also provide a film structure with a high breakdown voltage and a low leakage current. In some embodiments, introducing a limited amount of oxygen or nitrogen into a silicon carbide class of material will cause leakage paths provided by Si—H bonds and/or Si—$CH_2$—Si bonds to be blocked by oxygen or nitrogen. The mode of conduction may be different in Si—O and Si—N at low fields. Remote plasma treatment can provide improved electrical properties while maintaining a relatively low dielectric constant. In various embodiments, the film has an effective dielectric constant of about 6.0 or lower, or about 5.0 or lower, or about 4.0 or lower, and in some cases about 3.5 or lower, and some cases about 3.0 or lower, and in still other implementations about 2.5 or lower. The effective dielectric constant can depend on the bonding and density.

Figure 6A:
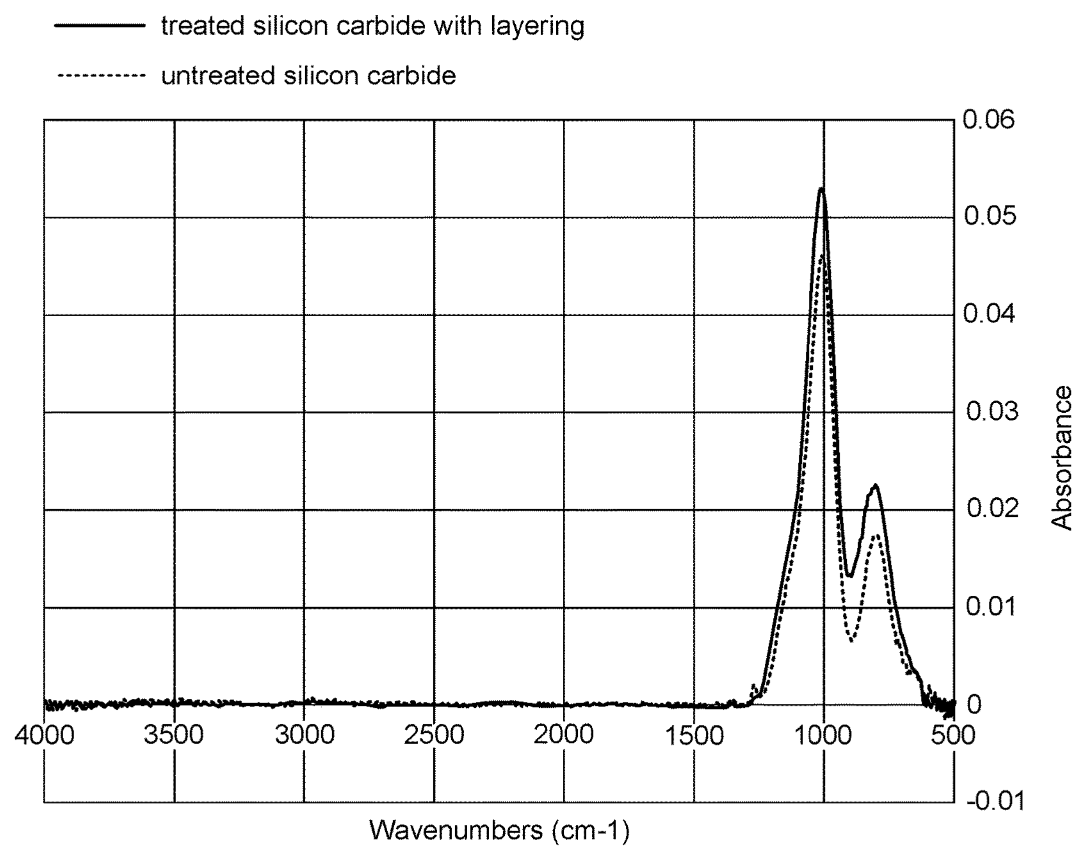
FIG. 6A shows a Fourier-Transform infrared spectroscopy (FTIR) absorbance spectrum with various vibration peaks for detecting certain bond types in a treated silicon carbide film with layering and a treated silicon carbide film without layering.
Figure 6B:
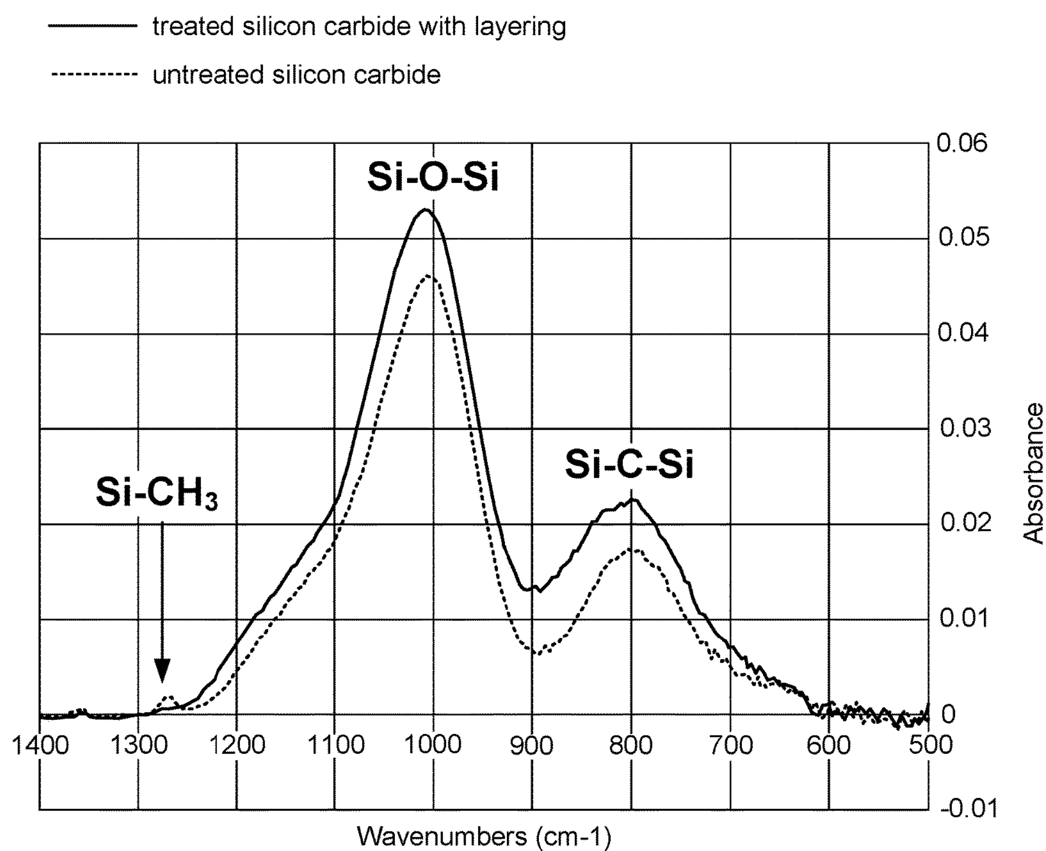
FIGS. 6B-6E show magnified views of the FTIR absorbance spectrum in FIG. 6A for various vibration peaks for detecting certain bond types in a treated silicon carbide film with layering and a treated silicon carbide film without layering.
Figure 6C:
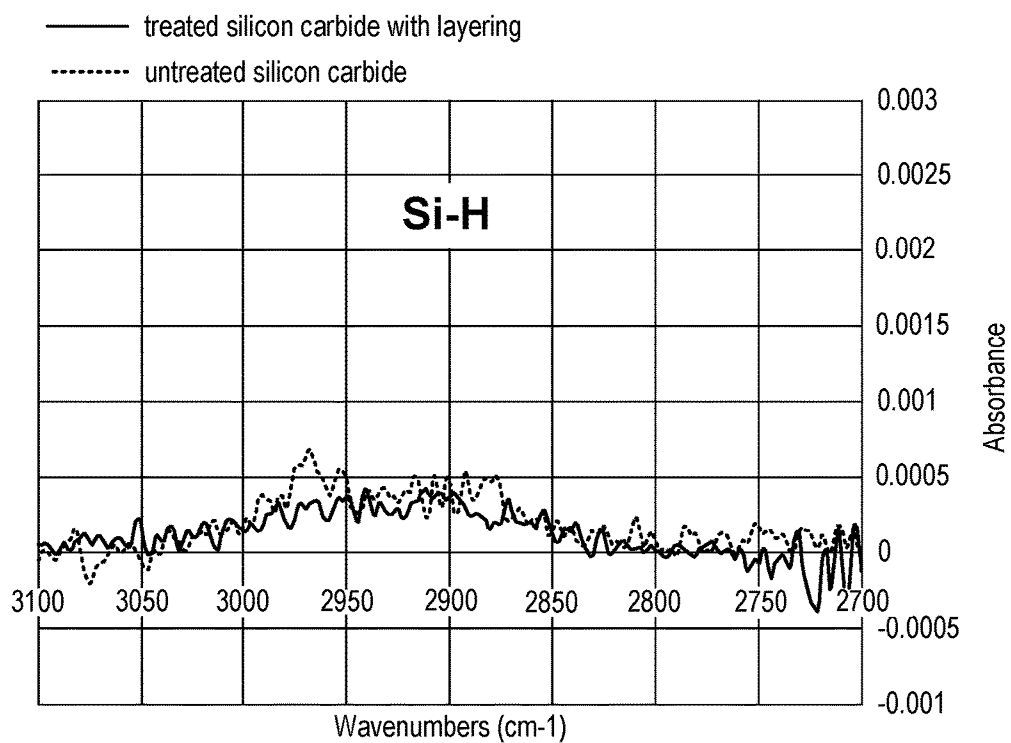
Figure 6D:
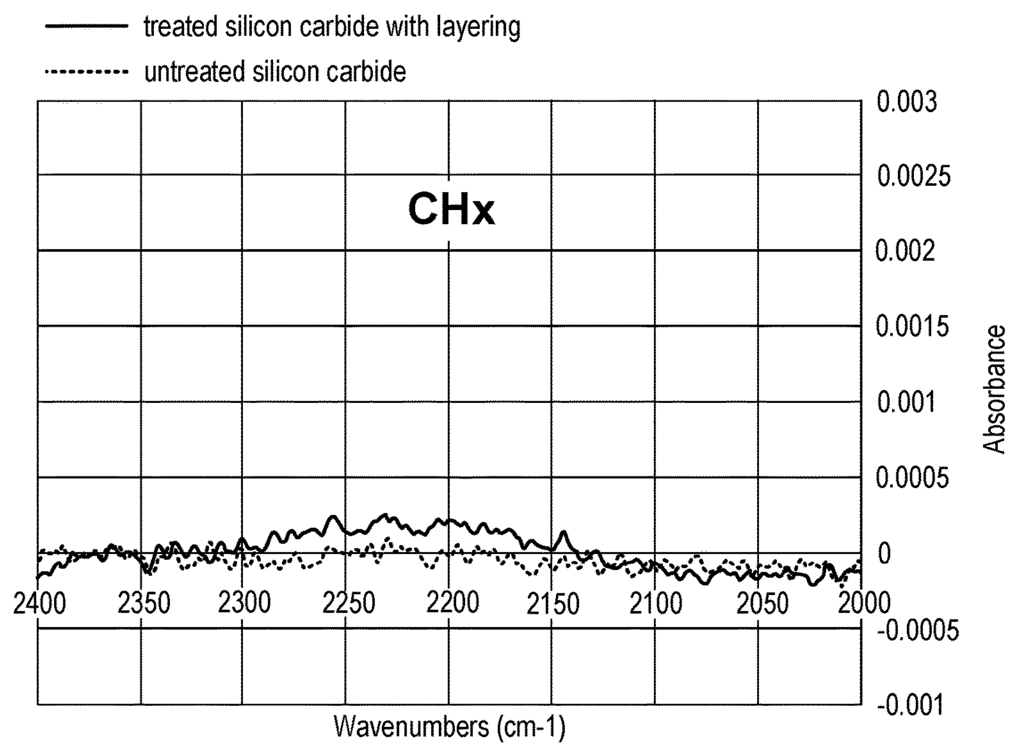
Figure 6E:
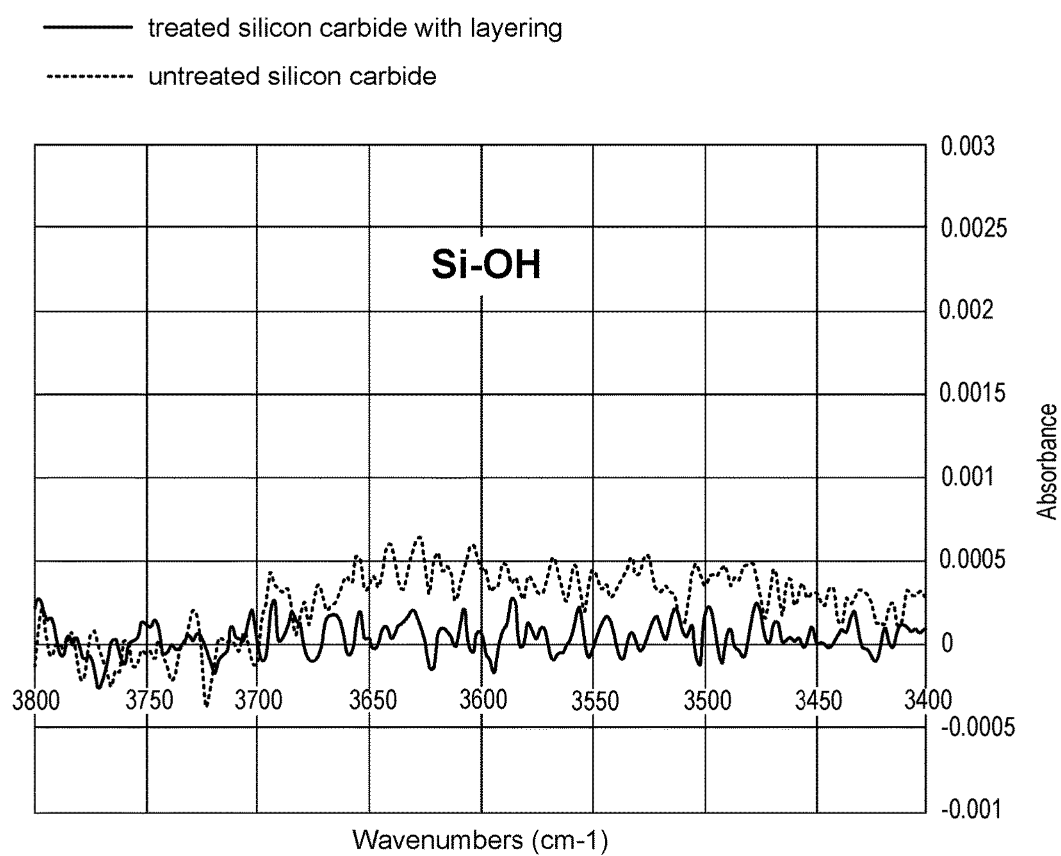

FIG. 6A shows a Fourier-Transform infrared spectroscopy (FTIR) absorbance spectrum with various vibration peaks for detecting certain bond types in a treated silicon carbide film with layering and an untreated silicon carbide film. FIGS. 6B-6E show magnified views of the FTIR absorbance spectrum in FIG. 6A for various vibration peaks for detecting certain bond types in a treated silicon carbide film with layering and an untreated silicon carbide film. The treated silicon carbide film with layering and the untreated silicon carbide film share the same thickness. FIG. 6B shows an increase in Si—O peaks and Si—C peaks for a silicon carbide film treated in a layer-by-layer approach. The higher peaks correspond to more Si—O and Si—C bonds per unit volume. Without being limited by any theory, the increase in the bond density of Si—C bonds is likely to result from cross-linking of Si—$CH_3$ groups. The increase in the bond density of Si—O bonds is likely to result from cross-linking of Si—OH groups.

Remote plasma treatment with layering may improve the properties of the silicon carbide film. For example, the treated silicon carbide film with layering may exhibit greater dry etch selectivity over oxide/nitride. The treated silicon carbide film with layering may also exhibit greater thermal stability and chemical stability. Moreover, the treated silicon carbide film with layering may exhibit improved oxygen plasma ash resistance. Table 1 shows the amount of silicon carbide film removed during an oxygen plasma ashing process for removing photoresist followed by a hydrogen fluoride (HF) wet etching process for removing $SiO_2$. Specifically, the silicon carbide film is exposed to 30 seconds of $O_2$ plasma treatment at 400° C. and 10 minutes of dipping in an HF bath. In Table 1, X can be a value between about 10 seconds and about 200 seconds, and Y can be a value between about 5 seconds and about 50 seconds. The results of Table 1 show that the amount of film loss at the center of the silicon carbide film decreases with longer treatment times for each treatment cycle. Additionally, the amount of film loss at the center of the silicon carbide film decreases with shorter deposition times for each deposition cycle. Thus, thinner layers per deposition cycle improve the etch resistance and chemical stability of the treated silicon carbide film.

TABLE 1

| Film | Deposition time per layer | Treatment time per layer | Center film removal (normalized) |
|---|---|---|---|
| k = 4.1 film | 2X | Y | 1.00 |
| | 2X | 2Y | 0.68 |
| | 2X | 3Y | 0.55 |
| | X | Y | 0.56 |
| | X | 2Y | 0.44 |
| | X | 3Y | 0.40 |
| k = 4.2 film | 2X | Y | 1.00 |
| | 2X | 3Y | 0.51 |
| | X | Y | 0.62 |
| | X | 2Y | 0.51 |
| | X | 3Y | 0.43 |

Apparatus

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety and for all purposes.

Figure 3:
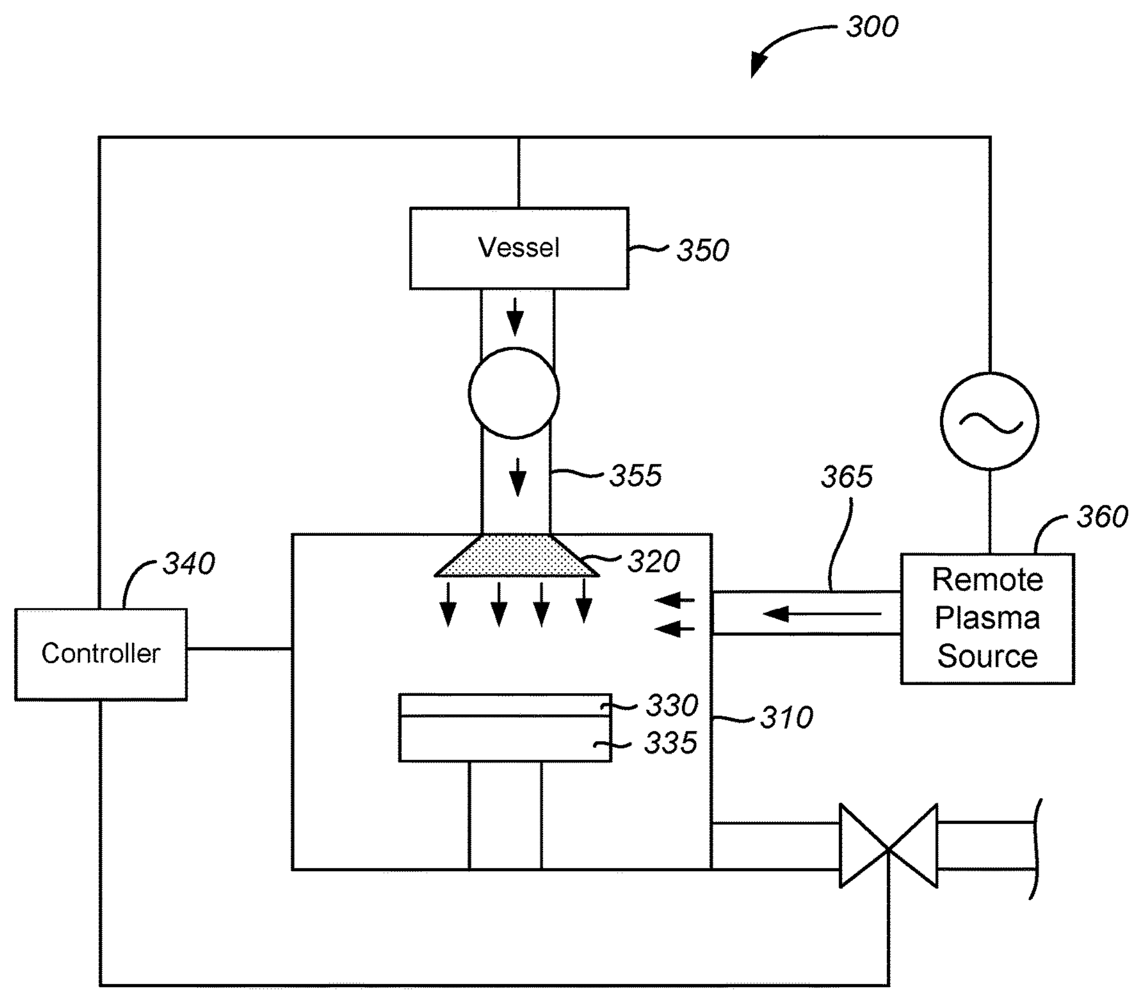
FIG. 3 illustrates a schematic diagram of an apparatus with a remote plasma source.

FIG. 3 presents a schematic diagram of a remote plasma apparatus according to certain embodiments. The device 300 includes a reaction chamber 310 with a showerhead assembly 320. Inside the reaction chamber 310, a substrate 330 rests on a stage or pedestal 335. In some embodiments, the pedestal 335 can be fitted with a heating/cooling element. A controller 340 may be connected to the components of the device 300 to control the operation of the device 300. For example, the controller 340 may contain instructions for controlling process conditions for the operations of the device 300, such as the temperature process conditions and/or the pressure process conditions. In some embodiments, the controller 340 may contain instructions for controlling the flow rates of precursor gas, co-reactant gas, source gas, and carrier gas. The controller 340 may contain instructions for controlling deposition time in a deposition cycle and treatment time in a treatment cycle. In addition, the controller 340 may contain instructions for adjusting pressure, RF power, gas flow, and gas composition for a deposition cycle or treatment cycle.

During operation, gases or gas mixtures are introduced into the reaction chamber 310 via one or more gas inlets coupled to the reaction chamber 310. In some embodiments, two or more gas inlets are coupled to the reaction chamber 310. A first gas inlet 355 can be coupled to the reaction chamber 310 and connected to a vessel 350, and a second gas inlet 365 can be coupled to the reaction chamber 310 and connected to a remote plasma source 360. In embodiments including remote plasma configurations, the delivery lines for the precursors and the radical species generated in the remote plasma source are separated. Hence, the precursors and the radical species do not substantially interact before reaching the substrate 330.

One or more radical species may be generated in the remote plasma source 360 and configured to enter the reaction chamber 310 via the gas inlet 365. Any type of plasma source may be used in remote plasma source 360 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 360 can be the GAMMA®, manufactured by Lam Research Corporation of Fremont, Calif. Another example of such a RF remote plasma source 360 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 360, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 350 and can be supplied to the showerhead 320 via the first gas inlet 355. The showerhead 320 distributes the precursors into the reaction chamber 310 toward the substrate 330. The substrate 330 can be located beneath the showerhead 320. It will be appreciated that the showerhead 320 can have any suitable shape, and may have any number and arrangement of ports for distributing gases to the substrate 330. The precursors can be supplied to the showerhead 320 and ultimately to the substrate 330 at a controlled flow rate.

The one or more radical species formed in the remote plasma source 360 can be carried in the gas phase toward the substrate 330. The one or more radical species can flow through a second gas inlet 365 into the reaction chamber 310. It will be understood that the second gas inlet 365 need not be transverse to the surface of the substrate 330 as illustrated in FIG. 3. In certain embodiments, the second gas inlet 365 can be directly above the substrate 330 or in other locations. The distance between the remote plasma source 360 and the reaction chamber 310 can be configured to provide mild reactive conditions such that the ionized species generated in the remote plasma source 360 are substantially neutralized, but at least some radical species in substantially low energy states remain in the environment adjacent to the substrate 330. Such low energy state radical species are not recombined to form stable compounds. The distance between the remote plasma source 360 and the reaction chamber 310 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 310), and other factors. In some embodiments, the distance between the remote plasma source 360 and the reaction chamber 310 can be between about 1 cm and 30 cm, such as about 5 cm or about 15 cm.

In some embodiments, a co-reactant, which is not the primary silicon-containing precursor or a hydrogen radical, is introduced during the deposition cycle or treatment cycle. In some implementations, the apparatus is configured to introduce the co-reactant through the second gas inlet 365, in which case the co-reactant is at least partially converted to plasma. In some implementations, the apparatus is configured to introduce the co-reactant through the showerhead 320 via the first gas inlet 355. Examples of co-reactant include oxygen, nitrogen, ammonia, carbon dioxide, carbon monoxide, and the like.

The controller 340 may contain instructions for controlling process conditions for the operation of the device 300. The controller 340 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 340 or they may be provided over a network.

In certain embodiments, the controller 340 controls all or most activities of the semiconductor processing device 300 described herein. For example, the controller 340 may control all or most activities of the semiconductor processing device 300 associated with depositing a silicon carbide film and treating the silicon carbide film to densify the silicon carbide film. The controller 340 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 340 may be employed in some embodiments. To provide relatively mild reactive conditions at the environment adjacent to the substrate 330, parameters such as the RF power levels, gas flow rate to the remote plasma region, and timing of the plasma ignition can be adjusted and maintained by controller 340. Additionally, adjusting the substrate position may further reduce the presence of high-energy radical species at the environment adjacent to the substrate 330. In a multi-station reactor, the controller 340 may comprise different or identical instructions for different apparatus stations, thus allowing the apparatus stations to operate either independently or synchronously.

In some embodiments, the controller 340 may include instructions for performing operations such as providing a substrate 330 in a reaction chamber 310, depositing a first thickness of a silicon carbide film on the substrate 330, exposing the first thickness of the silicon carbide film to remote hydrogen plasma treatment, depositing a second thickness of the silicon carbide film over the first thickness of the silicon carbide film, and exposing the second thickness of the silicon carbide film to remote hydrogen plasma treatment. In some embodiments, exposing the first and second thickness of the silicon carbide film to remote hydrogen plasma treatment includes flowing one or more radicals of hydrogen in a substantially low energy state from a remote plasma source 360.

In some embodiments, the apparatus may include a user interface associated with controller 340. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, treatment times, deposition times, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to the silicon carbide deposition and treatment described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Applications

The present disclosure may be further understood by reference to the following applications for high-quality silicon carbide films, including densified silicon carbide films, for which the applications are intended to purely serve as examples. The present disclosure is not limited in scope by the specified applications, which are simply illustrations of aspects of the disclosure.

In some embodiments, a silicon carbide film may be deposited over exposed copper. In depositing the silicon carbide film, reaction conditions adjacent to the substrate can be free of oxidants, such as $O_2$, $O_3$, and $CO_2$, including radicals thereof. Thus, the silicon carbide film may be deposited directly over the exposed copper without oxidizing copper (e.g., creating cupric oxide). Such films can serve as etch stop layers, which can also serve as copper diffusion barriers. The presence of the silicon carbide film can provide a sufficiently low dielectric constant with excellent leakage properties to serve as a diffusion barrier. The silicon carbide film can be an etch stop and/or diffusion barrier either by itself, or as a bilayer stack (e.g., silicon carbide/SiCN bilayer deposited over exposed copper), or as a graded film (e.g., graded SiCO film) or multi-layer stack (e.g., multi-layered SiCO film). In some embodiments, the silicon carbide film can be placed in between adjacent metallization layers that are typically produced by a damascene process. The silicon carbide film can resist etching and can be sufficiently dense to minimize the diffusion of copper ions into adjacent regions of dielectric material. In some embodiments, the precursor employed for the silicon carbide film can be non-cyclic. Non-cyclic precursors can include PMDSO or TMDSO. The non-cyclic precursor can provide a sufficiently high density to serve as a hermetic or diffusion barrier. In some embodiments, nitrogen may be incorporated into the film by employing nitrogen-containing precursors or plasma activating nitrogen-containing radicals, such as elemental nitrogen radicals or amine radicals.

In some embodiments, a silicon carbide film may be deposited as vertical structures adjacent to metal or semiconductor structures. Deposition of silicon carbide provides excellent step coverage along sidewalls of the metal or semiconductor structures to create the vertical structures. In certain embodiments, the vertical structures may be referred to as spacers or liners. FIG. 1B illustrates a cross-section of silicon carbide liners deposited on the sidewalls of a gate electrode structure of a transistor. As illustrated in FIG. 1B, the transistor can be a CMOS transistor with a silicon substrate 110 having a source 112 and a drain 113. A gate dielectric 114 can be deposited over the silicon substrate 110, and a gate electrode can be deposited over the gate dielectric 115 to form the transistor. Silicon carbide liners 111 can be deposited on the sidewalls of the gate electrode 115 and gate dielectric 114. In another example, FIG. 1C illustrates a cross-section of silicon carbide deposited on sidewalls of exposed copper lines in an air gap type metallization layer. Air gaps 120 can be introduced into an integrated circuit layer between copper lines 122 that can reduce the effective k-value of the layer. Silicon carbide liners 121 can be deposited on the sidewalls of the copper lines 122, and a nonconformal dielectric layer 123 can be deposited the air gaps 120, liners 121, and copper lines 122. Examples of such air gap type metallization layers can be described in U.S. Patent Publication No. 2004/0232552 to Fei Wang et al., which is herein incorporated by reference in its entirety and for all purposes.

In some embodiments, a silicon carbide film may be deposited on the sidewalls of patterned porous dielectric materials. Ultra low-k dielectric materials can be made from a porous structure. The pores in such materials can provide areas for ingress of metal during deposition of subsequent layers, including the deposition of diffusion barriers containing a metal such as tantalum (Ta). If too much metal migrates into the dielectric material, the dielectric material may provide a short circuit between adjacent copper metallization lines. FIG. 1D illustrates a cross-section of silicon carbide as a pore sealant for porous dielectric materials. A porous dielectric layer 132 can have a plurality of trenches or vias cut into the porous dielectric layer 132 to form pores 130. Silicon carbide 131 can be deposited along the pores 130 to effectively seal the pores 130. Sealing the pores 130 with the silicon carbide 131 can avoid damaging the porous dielectric layer 132 that may otherwise be incurred by other sealing techniques using a plasma. The silicon carbide 131 can be sufficiently dense as a pore sealant and may include non-cyclic silicon-containing precursors, such as PMDSO and TMDSO. In some embodiments, an etched dielectric material such as the porous dielectric layer 132 may first be treated by a "k-recovery" process, which exposes the porous dielectric layer 132 to UV radiation and a reducing agent. This recovery process is further described in commonly owned U.S. Patent Publication No. 2011/0111533 to Varadarajan et al., which is incorporated by reference herein in its entirety and for all purposes. In another "k-recovery" process, the porous dielectric layer 132 can be exposed to UV radiation and a chemical silylating agent. This recovery process is further described in commonly owned U.S. Patent Publication No. 2011/0117678 to Varadarajan et al., which is incorporated by reference herein in its entirety and for all purposes. After exposing the pores 130 to the recovery treatment, which makes the surface more hydrophilic and provides a monolayer of material, a layer of conformally deposited silicon carbide 131 can be deposited to effectively seal the pores of the porous dielectric layer 132.

In some embodiments, a silicon carbide film may be deposited as an ultra low-k dielectric material itself. Ultra low-k dielectrics are conventionally defined as those materials that have a dielectric constant lower than that of 2.5. In such configurations, the ultra low-k dielectric material of silicon carbide can be a porous dielectric layer. The pores of the dielectric layer can be introduced by using cyclic or caged precursor molecules, including the cyclic siloxanes and silsesquioxanes. In one example, the porosity of the ultra low-k dielectric layer of silicon carbide can be between about 20% and 50%. Further, the ultra low-k dielectric layer can have an average pore size of less than about 100 Å, such as between about 5 Å and 20 Å. For example, a cyclosiloxane ring can have a radius of about 6.7 Å. While increasing the number and size of the pores can lower the dielectric constant, the mechanical integrity of the dielectric layer can be compromised if it is too porous.

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of densifying a silicon carbide film, the method comprising:

providing a substrate in a reaction chamber;

depositing a first thickness of a silicon carbide material on the substrate in a first step of a process of depositing a silicon carbide film;

exposing the first thickness of the silicon carbide material to remote hydrogen plasma treatment, wherein the first thickness of the silicon carbide material is densified during the process of depositing the silicon carbide film;

depositing a second thickness of a silicon carbide material over the first thickness of the silicon carbide material in a second step of the process of depositing the silicon carbide film; and exposing the second thickness of the silicon carbide material to remote hydrogen plasma treatment, wherein the second thickness of the silicon carbide material is densified in the process of depositing the silicon carbide film, wherein each of the first thickness and the second thickness is between about 5 Å and about 30 Å.

2. The method of claim 1, wherein depositing the first thickness of the silicon carbide material includes:

(a) flowing one or more silicon-containing precursors into the reaction chamber; and (b) flowing one or more hydrogen radicals generated from a remote plasma source to react with the one or more silicon-containing precursors for a first time period, wherein depositing the second thickness of the silicon carbide material includes repeating operations (a) and (b) for a second time period.

3. The method of claim 2, wherein each of the one or more silicon-containing precursors have (i) one or more silicon-hydrogen bonds and/or silicon-silicon bonds, and (ii) one or more silicon-carbon bonds, silicon-nitrogen bonds, and/or silicon-oxygen bonds.

4. The method of claim 3, wherein each of the one or more silicon-containing precursors is selected from a group consisting of: a cyclic siloxane, a linear siloxane, an alkoxy silane, an alkyl silane, and a silazane.

5. The method of claim 2, wherein at least 90% of the hydrogen radicals are hydrogen radicals in a ground state.

6. The method of claim 2, wherein the first time period is different than the second time period.

7. The method of claim 2, wherein the first time period is identical to the second time period.

8. The method of claim 1, wherein exposing the first thickness of the silicon carbide material to remote hydrogen plasma treatment includes:

(c) flowing a source gas of hydrogen into a remote plasma source;

(d) flowing an inert gas with the source gas of hydrogen;

(e) generating, from the source gas of hydrogen, radicals of hydrogen in the remote plasma source; and (f) flowing the radicals of hydrogen to the first thickness of the silicon carbide material, wherein exposing the second thickness of the silicon carbide material to remote hydrogen plasma treatment includes repeating operations (c) through (f) on the second thickness of the silicon carbide material.

9. The method of claim 8, wherein the inert gas is helium, the source gas of hydrogen in the helium having a concentration of 1-10% hydrogen.

10. The method of claim 8, wherein at least 90% of the hydrogen radicals are hydrogen radicals in a ground state.

11. The method of claim 8, wherein exposing the first thickness of the silicon carbide material to remote hydrogen plasma treatment further includes:

(g) flowing a co-reactant gas with the source gas, wherein the co-reactant gas includes oxygen ($O_2$), nitrogen ($N_2$), carbon dioxide ($CO_2$), carbon monoxide (CO), water ($H_2O$), methanol ($CH_3OH$), ozone ($O_3$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), or combinations thereof, wherein exposing the second thickness of the silicon carbide material to remote hydrogen plasma treatment further includes repeating operation (g) to the second thickness of the silicon carbide material.

12. The method of claim 11, wherein the co-reactant gas includes $O_2$ or $N_2$.

13. The method of claim 1, wherein a pressure in the reaction chamber is between about 0.2 Torr and about 5 Torr.

14. The method of claim 1, wherein depositing the first thickness of the silicon carbide material, exposing the first thickness of the silicon carbide material to remote hydrogen plasma treatment, depositing the second thickness of the silicon carbide material, and exposing the second thickness of the silicon carbide material to remote hydrogen plasma treatment occur without introducing a vacuum break.

15. The method of claim 1, wherein the substrate has a plurality of features, each of the features having a depth to width aspect ratio of greater than 5:1.

16. The method of claim 1, wherein the silicon carbide film, prior to exposing the first and second thickness of the silicon carbide material to remote hydrogen plasma treatment, includes (1) Si—O and/or Si—C bonds, and (2) terminal $CH_3$ bonds, Si—OH bonds, and/or Si—H bonds.

17. The method of claim 16, wherein the remote hydrogen plasma treatment is configured to increase a number of Si—O and/or Si—C bonds, and decrease a number of the terminal $CH_3$ bonds, Si—OH bonds, and/or Si—H bonds in the silicon carbide film.

18. The method of claim 1, wherein the silicon carbide film is a doped silicon carbide film, the doped silicon carbide film including silicon oxycarbide (SiCO), silicon nitricarbide (SiCN), or silicon oxynitricarbide (SiONC) on the substrate.

19. The method of claim 1, wherein exposing the first thickness of the silicon carbide material to remote hydrogen plasma treatment occurs for a duration between about 5 seconds and about 50 seconds, and exposing the second thickness of the silicon carbide material to remote hydrogen plasma treatment occurs for a duration between about 5 seconds and about 50 seconds.

* * * * *